United States Patent
Jin

(10) Patent No.: US 12,495,627 B2
(45) Date of Patent: Dec. 9, 2025

(54) IMAGE SENSOR

(71) Applicant: SAMSUNG ELECTRONICS CO., LTD., Suwon-si (KR)

(72) Inventor: Younggu Jin, Osan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 472 days.

(21) Appl. No.: 17/993,652

(22) Filed: Nov. 23, 2022

(65) Prior Publication Data

US 2023/0268358 A1    Aug. 24, 2023

(30) Foreign Application Priority Data

Feb. 18, 2022  (KR) .......................... 10-2022-0021567

(51) Int. Cl.
*H10F 39/00*   (2025.01)
*H10F 39/18*   (2025.01)

(52) U.S. Cl.
CPC ....... *H10F 39/8033* (2025.01); *H10F 39/182* (2025.01)

(58) Field of Classification Search
CPC .......... H10D 8/055; H10D 8/40; H10D 8/024; H10F 30/225; H10F 39/12–199; H10F 39/014; G01S 17/00–95; H10H 20/00–882; H10H 29/00–142; H10H 29/30–962; H01S 5/00; H10K 50/00–88; H10K 59/00–95; H10K 65/00; H10K 71/00–861; H10K 85/00–791; H10K 2101/00–90; B32B 2457/206

See application file for complete search history.

(56) References Cited

U.S. PATENT DOCUMENTS

| | | | |
|---|---|---|---|
| 8,476,730 B2 | 7/2013 | Sanfilippo et al. | |
| 9,040,890 B2 | 5/2015 | Fereyre et al. | |
| 9,653,514 B2 | 5/2017 | Tachino et al. | |
| 9,654,713 B2 | 5/2017 | Hynecek et al. | |
| 10,141,458 B2 | 11/2018 | Zhang et al. | |
| 10,204,950 B1* | 2/2019 | Yamashita | H10F 39/811 |
| 10,205,932 B2 | 2/2019 | Kautzsch | |
| 10,560,652 B2 | 2/2020 | Sano | |
| 2018/0026147 A1* | 1/2018 | Zhang | H10F 77/959 |
| | | | 257/292 |

(Continued)

FOREIGN PATENT DOCUMENTS

KR   10-1707747 B1   2/2017
KR   10-2023-0136286 A   9/2023

*Primary Examiner* — Christine S. Kim
*Assistant Examiner* — Cole Leon Lindsey
(74) *Attorney, Agent, or Firm* — Sughrue Mion, PLLC

(57) ABSTRACT

An image sensor is provided. The image sensor includes: a photoelectric conversion region in a semiconductor substrate; a photocharge collection region provided in the photoelectric conversion region; a floating diffusion region in the semiconductor substrate that is spaced apart from the photocharge collection region along a vertical direction; a charge multiplication region between the photocharge collection region and the floating diffusion region; and a vertical gate electrode which extends into the semiconductor substrate and overlaps the photocharge collection region along the vertical direction. A side surface of the vertical gate electrode is adjacent to the floating diffusion region and the charge multiplication region.

20 Claims, 18 Drawing Sheets

(56) References Cited

U.S. PATENT DOCUMENTS

| | | |
|---|---|---|
| 2018/0308881 A1* | 10/2018 | Hynecek ................ G01S 17/10 |
| 2020/0213542 A1 | 7/2020 | Ikeda |
| 2023/0317742 A1 | 10/2023 | Jin |

* cited by examiner

IMAGE SENSOR

CROSS-REFERENCE TO RELATED APPLICATIONS

This application claims priority under 35 U.S.C. § 119 to Korean Patent Application No. 10-2022-0021567, filed on Feb. 18, 2022, in the Korean Intellectual Property Office, the disclosure of which is hereby incorporated by reference in its entirety.

BACKGROUND

The present disclosure relates to an image sensor, and more particularly, to an image sensor using an avalanche phenomenon.

An image sensor may be an electronic device for converting an optical image into electrical signals. As computer and communication industries have been developed, high-performance image sensors have been increasingly implemented in various devices such as a digital camera, a camcorder, a personal communication system (PCS), a game console, a security camera, and a medical micro camera. In addition, image sensors (e.g., a distance sensor using a time-of-flight (ToF)) for realizing a three-dimensional image as well as a color image have been developed.

SUMMARY

One or more embodiments provide an image sensor having high reliability, high sensitivity and a small size.

According to an aspect of an embodiment, an image sensor includes: a photoelectric conversion region in a semiconductor substrate; a photocharge collection region provided in the photoelectric conversion region; a floating diffusion region in the semiconductor substrate that is spaced apart from the photocharge collection region along a vertical direction; a charge multiplication region between the photocharge collection region and the floating diffusion region; and a vertical gate electrode which extends into the semiconductor substrate and overlaps the photocharge collection region along the vertical direction. A side surface of the vertical gate electrode is adjacent to the floating diffusion region and the charge multiplication region.

According to an aspect of an embodiment, an image sensor includes: a semiconductor substrate that has a first conductivity type; a photoelectric conversion region that has a second conductivity type and is provided in the semiconductor substrate; a photocharge collection region that has the second conductivity type and is provided in the photoelectric conversion region; a floating diffusion region that has the second conductivity type and is spaced apart from the photocharge collection region along a vertical direction; a charge multiplication region that has the first conductivity type and is provided between the photocharge collection region and the floating diffusion region; a vertical gate electrode which extends into the semiconductor substrate, overlaps the photocharge collection region along the vertical direction, and surrounds the floating diffusion region and the charge multiplication region; and an anode region that has the first conductivity type and is provided in the semiconductor substrate outside the vertical gate electrode.

According to an aspect of an embodiment, an image sensor includes: a semiconductor substrate that has a first conductivity type; a pixel isolation structure in the semiconductor substrate that defines a plurality of pixel regions; a photoelectric conversion region provided in the semiconductor substrate in each of the plurality of pixel regions and including dopants having a second conductivity type; a photocharge collection region that has the second conductivity type and is provided in the photoelectric conversion region; a floating diffusion region that has the second conductivity type, is adjacent to a first surface of the semiconductor substrate in each of the plurality of pixel regions and is spaced apart from the photocharge collection region along a vertical direction; a charge multiplication region that has the first conductivity type and is provided between the photocharge collection region and the floating diffusion region; a vertical gate electrode that extends into the semiconductor substrate, overlaps the photocharge collection region along the vertical direction, and surrounds the floating diffusion region and the charge multiplication region; an anode region that has the first conductivity type and is provided in the semiconductor substrate outside the vertical gate electrode; and a plurality of micro lenses disposed on a second surface of the semiconductor substrate and provided on the plurality of pixel regions, respectively.

BRIEF DESCRIPTION OF THE DRAWINGS

The above and other aspects and features will be more apparent from the following description of embodiments taken in conjunction with the accompanying drawings, in which.

DETAILED DESCRIPTION

Example embodiments will now be described more fully with reference to the accompanying drawings. Embodiments described herein are provided as examples, and thus, the present disclosure is not limited thereto, and may be realized in various other forms. Each embodiment provided in the following description is not excluded from being associated with one or more features of another example or another embodiment also provided herein or not provided herein but consistent with the present disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 1:
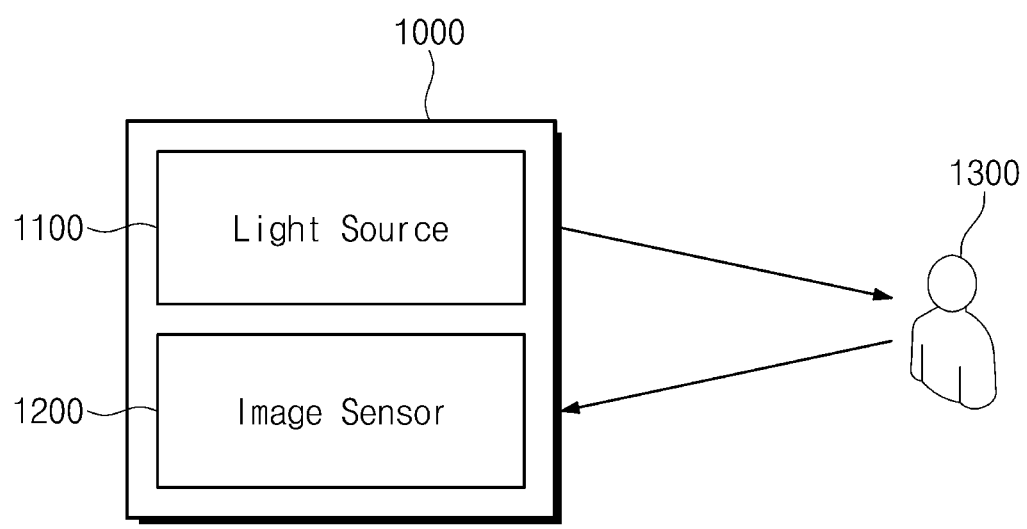
FIG. 1 is a schematic view illustrating an image sensor system according to some embodiments.

FIG. 1 is a schematic view illustrating an image sensor system according to some embodiments.

Referring to FIG. 1, an image sensor system 1000 according to some embodiments may irradiate light to an object 1300 and may sense light reflected from the object 1300 to detect an optical depth or a distance of the object 1300. The image sensor system 1000 may include a light source 1100 for irradiating light to the object 1300 corresponding to a target, and an image sensor 1200 for sensing light reflected from the object 1300.

The light source 1100 may irradiate an optical signal in the form of a pulse to the object 1300. For example, the light source 1100 may use infrared light, a microwave, a light wave, or an ultrasonic wave. According to some embodiments, a light emitting diode (LED), a laser diode (LD) or an organic light emitting diode (OLED) may be used as the light source 1100.

The image sensor 1200 may sense light reflected from the object 1300 and output optical depth information about the object 1300 based on the sensed light. The image sensor 1200 may include an avalanche photodiode (APD) or a single-photon avalanche diode (SPAD). The image sensor 1200 may detect a time for which a current instantaneously flows when avalanche amplification occurs, thereby measuring an optical depth or a distance with high precision.

The optical depth information obtained from the image sensor 1200 may be used to realize a three-dimensional image. The image sensor 1200 may be an infrared light camera. In addition, a three-dimensional color image may also be obtained using the image sensor 1200 and the three-dimensional color image may include depth pixels and visible light pixels.

Figure 2:
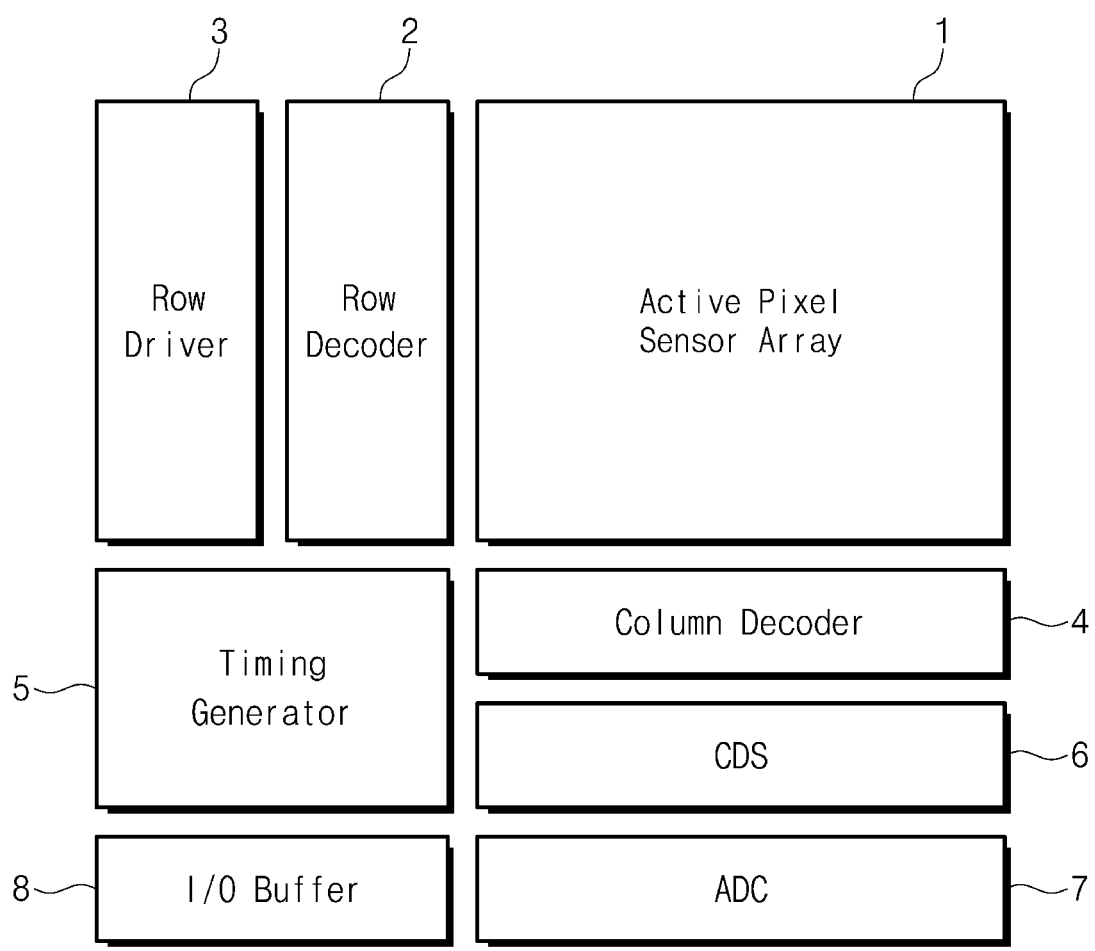
FIG. 2 is a block diagram illustrating an image sensor according to some embodiments.

FIG. 2 is a block diagram illustrating an image sensor according to some embodiments.

Referring to FIG. 2, an image sensor may include an active pixel sensor array 1, a row decoder 2, a row driver 3, a column decoder 4, a timing generator 5, a correlated double sampler (CDS) 6, an analog-to-digital converter (ADC) 7, and an input/output buffer (I/O buffer) 8.

The active pixel sensor array 1 may include a plurality of unit pixels two-dimensionally arranged. Each of the unit pixels may convert optical signals into electrical signals. Each of the unit pixels may include a single photodetector and a control transistor.

The row driver 3 may provide a plurality of driving signals for driving the plurality of unit pixels to the active pixel sensor array 1 according to signals decoded in the row decoder 2. When the unit pixels are arranged in a matrix form, the driving signals may be respectively provided to rows of the matrix.

The timing generator 5 may provide timing signals and control signals to the row decoder 2 and the column decoder 4.

The correlated double sampler 6 may receive electrical signals generated from the active pixel sensor array 1, and may hold and sample the received electrical signals. The correlated double sampler 6 may doubly sample a specific noise level and a signal level of the electrical signal, and may output a difference level corresponding to a difference between the noise level and the signal level.

The analog-to-digital converter 7 may convert an analog signal, which corresponds to the difference level output from the correlated double sampler 6, into a digital signal and may output the digital signal.

The I/O buffer 8 may latch the digital signals and may sequentially output the latched digital signals to an image signal processor according to signals decoded in the column decoder 4.

Figure 3:
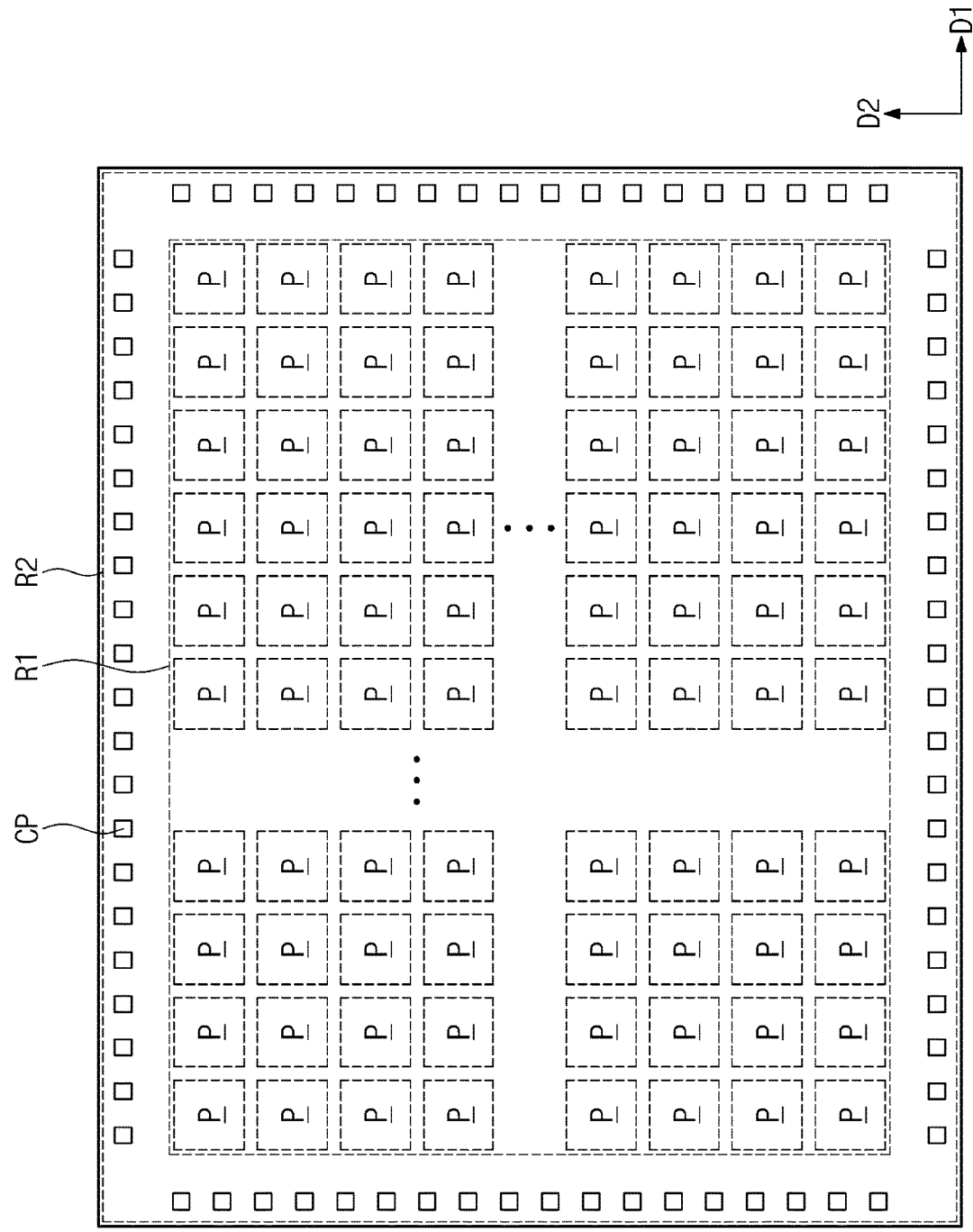
FIG. 3 is a schematic plan view illustrating an image sensor according to some embodiments.

FIG. 3 is a schematic plan view illustrating an image sensor according to some embodiments.

Referring to FIG. 3, an image sensor may include a pixel array region R1 and a pad region R2.

A plurality of unit pixels P two-dimensionally arranged in a first direction D1 and a second direction D2 which intersect each other may be disposed in the pixel array region R1. An electrical signal generated based on incident light may be output from each of the unit pixels P of the pixel array region R1.

In some embodiments, each of the unit pixels P may include a photodetector and a control transistor. In some embodiments, the photodetector may include a single-photon avalanche diode (SPAD) or an avalanche photodiode (APD). When one photon enters a PN junction region of a high electric field in a state in which a voltage much greater than a breakdown voltage is applied to the avalanche photodiode in each of the unit pixels P, avalanche amplification may occur, allowing for a time at which a current instantaneously flows to be detected and used to measure a distance with high precision.

The pad region R2 may surround the pixel array region R1 in a plan view to facilitate electrical connection with an external device. A plurality of conductive pads CP used to input/output control signals and photoelectric signals may be disposed in the pad region R2. Electrical signals generated from the unit pixels P may be output to the external device through the conductive pads CP. Control signals provided by the external device may be provided to the unit pixels P through the conductive pads CP.

Figure 4:
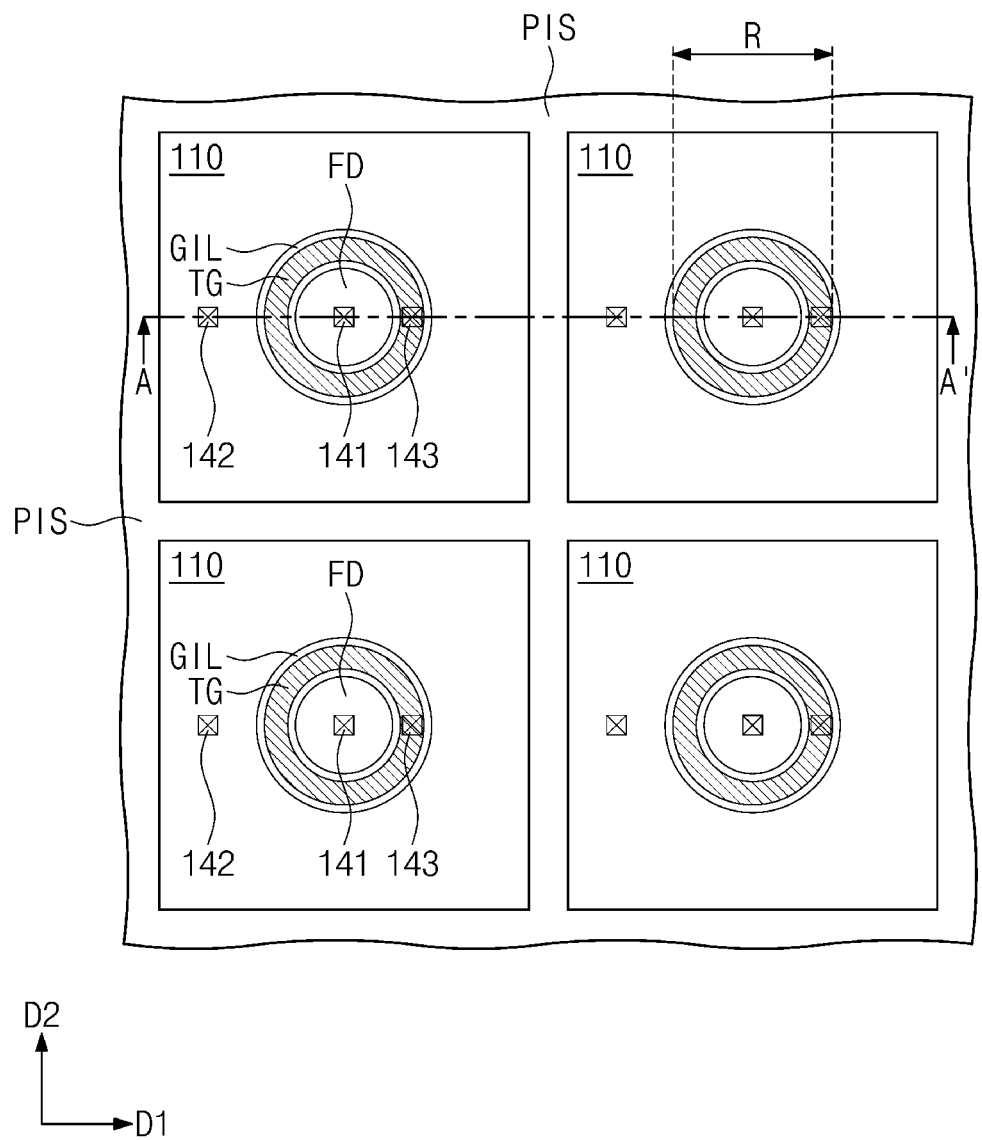
FIG. 4 is a plan view illustrating a portion of an image sensor according to some embodiments.
Figure 5:
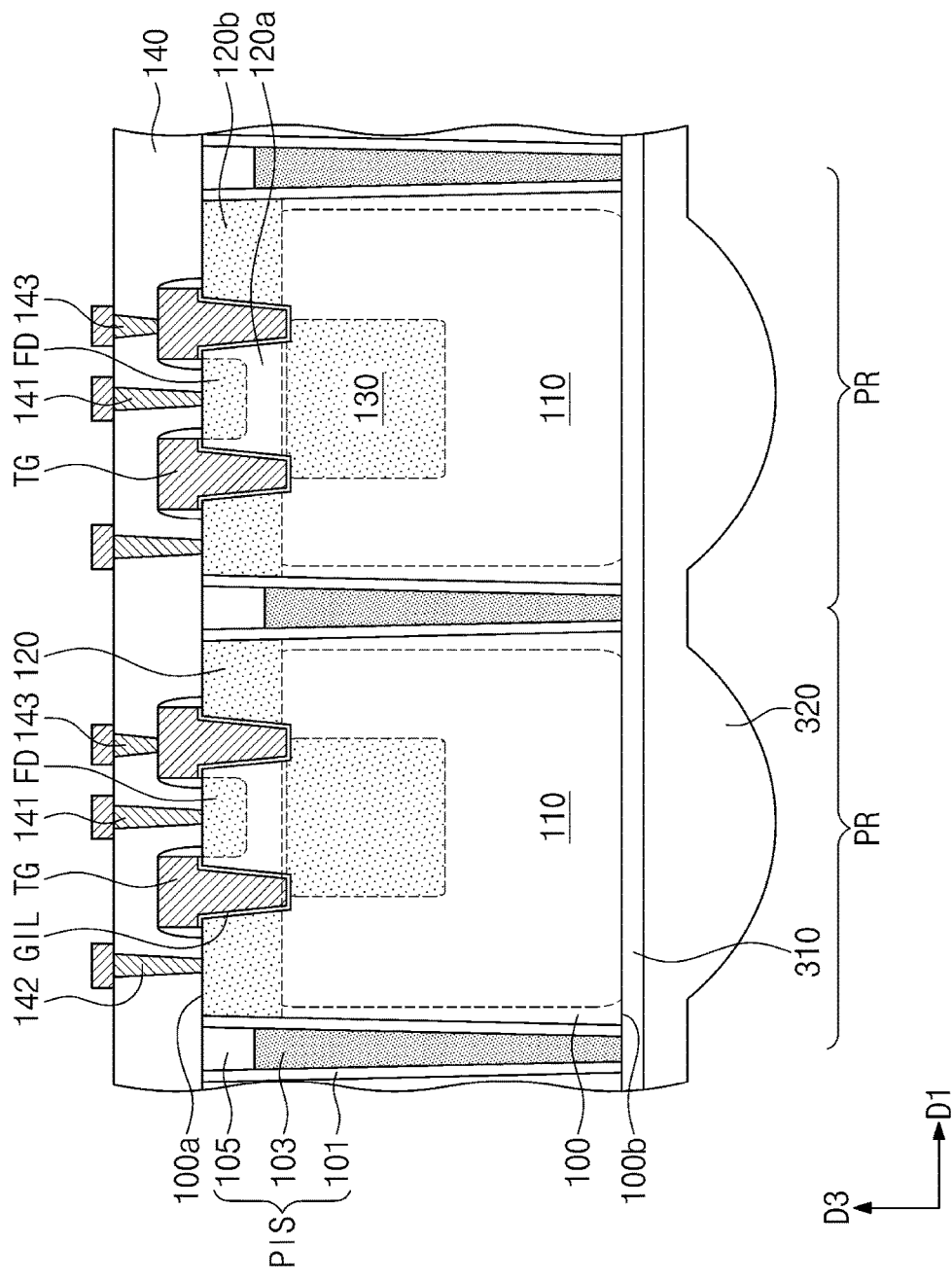
FIG. 5 is a cross-sectional view taken along a line A-A' of FIG. 4 to illustrate an image sensor according to some embodiments.

FIG. 4 is a plan view illustrating a portion of an image sensor according to some embodiments. FIG. 5 is a cross-sectional view taken along a line A-A' of FIG. 4 to illustrate an image sensor according to some embodiments.

Referring to FIGS. 4 and 5, an image sensor may include a plurality of pixel regions PR, and a single control transistor and a single photodetector may be provided in each of the pixel regions PR.

A semiconductor substrate 100 may have a first surface (or front surface) 100a and a second surface (or back surface) 100b, which are opposite to each other. For example, the semiconductor substrate 100 may include a semiconductor material or compound semiconductor material, which includes silicon (Si), germanium (Ge), gallium arsenic (GaAs), indium gallium arsenic (InGaAs), gallium phosphorus (GaP), or indium phosphorus (InP).

For example, the semiconductor substrate 100 may be a substrate in which an epitaxial layer having a first conductivity type (e.g., a p-type) is formed on a bulk silicon substrate having the first conductivity type and may be a substrate having the p-type epitaxial layer which remains by removing the bulk silicon substrate in a process of manufacturing an image sensor. Alternatively, the semiconductor substrate 100 may be a bulk semiconductor substrate including a well having the first conductivity type.

A pixel isolation structure PIS may be disposed in the semiconductor substrate 100 to define the plurality of pixel regions PR. The pixel regions PR may be arranged in a first direction D1 and a second direction D2 which intersect each other.

The pixel isolation structure PIS may vertically extend from the first surface 100a of the semiconductor substrate 100 to the second surface 100b of the semiconductor substrate 100. The pixel isolation structure PIS may include first portions extending in the first direction D1 in parallel to each other, and second portions intersecting the first portions and extending in the second direction D2 in parallel to each other.

The pixel isolation structure PIS may have a length in a direction (i.e., a third direction D3) perpendicular to a surface (e.g., the first surface 100a or the second surface 100b) of the semiconductor substrate 100. The length of the pixel isolation structure PIS may be substantially equal to a vertical thickness of the semiconductor substrate 100.

The pixel isolation structure PIS may include a liner insulating pattern 101, a conductive pattern 103, and a filling insulation pattern 105.

The liner insulating pattern 101 may be provided between the conductive pattern 103 and the semiconductor substrate 100. The liner insulating pattern 101 may be in direct contact with the semiconductor substrate 100. The liner insulating pattern 101 may include a material having a refractive index lower than that of the semiconductor substrate 100. For example, the liner insulating pattern 101 may include a silicon-based insulating material (e.g., silicon nitride, silicon oxide, and/or silicon oxynitride) and/or a high-k dielectric material (e.g., hafnium oxide and/or aluminum oxide). For example, the liner insulating pattern 101 may include a plurality of layers, and the layers may include different materials.

The conductive pattern 103 may include a crystalline semiconductor material such as poly-silicon. For example, the conductive pattern 103 may further include dopants doped in the semiconductor material, and the dopants may have the first conductivity type or a second conductivity type. The conductive pattern 103 may include undoped poly-silicon, doped poly-silicon, a metal (e.g., tungsten (W)), air, or any combination thereof. In some embodiments, a negative bias may be applied to the conductive pattern 103, which may reduce a dark current generated at a boundary between the pixel isolation structure PIS and the semiconductor substrate 100.

The filling insulation pattern 105 may be disposed on a top surface of the conductive pattern 103, and a top surface of the filling insulation pattern 105 may be located at substantially the same level along the third direction D3 as the first surface 100a of the semiconductor substrate 100. The filling insulation pattern 105 may include at least one of a silicon oxide layer, a silicon oxynitride layer, or a silicon nitride layer.

The photodetector and the control transistor may be provided in a central portion of each of the pixel regions PR. In some embodiments, the photodetector may be an avalanche photodiode (APD) or a single-photon avalanche diode (SPAD).

In detail, the photodetector may include a photoelectric conversion region 110 having the first or second conductivity type, a photocharge collection region 130 having the second conductivity type, a floating diffusion region FD having the second conductivity type, a charge multiplication region 120a between the photocharge collection region 130 and the floating diffusion region FD, and an anode region 120b.

In each of the pixel regions PR, the photoelectric conversion region 110 may be provided in the semiconductor substrate 100. The photoelectric conversion region 110 may have the same conductivity type (i.e., the first conductivity type) as the semiconductor substrate 100 or may have the second conductivity type different from the first conductivity type of the semiconductor substrate 100. For example, the semiconductor substrate 100 may be a p-type, and the photoelectric conversion region 110 may include n-type dopants. Photocharges may be generated in the photoelectric conversion region 110 by light incident on the second surface 100b of the semiconductor substrate 100.

In each of the pixel regions PR, the anode region 120b may be provided on the photoelectric conversion region 110. The anode region 120b may include dopants having the first conductivity type (e.g., a p-type).

To efficiently collect photocharges, the photocharge collection region 130 may be locally provided in the photoelectric conversion region 110 in each of the pixel regions PR. The photoelectric conversion region 110 may absorb light and generate photocharges based on the absorbed light. The photocharge collection region 130 may be formed by ion-implanting dopants having the second conductivity type, different from the first conductivity type of the semiconductor substrate 100, into the semiconductor substrate 100. For example, the photocharge collection region 130 may be an n-type dopant region within the p-type substrate 100. The photocharge collection region 130 having the second conductivity type may form a PN junction with the charge multiplication region 120a having the first conductivity type. A dopant concentration in the photocharge collection region 130 may be greater than a dopant concentration in the photoelectric conversion region 110.

The floating diffusion region FD may be vertically (i.e., along the third direction D3) spaced apart from the photocharge collection region 130 and may be provided in the semiconductor substrate 100. The floating diffusion region FD may be provided as a cathode electrode of the avalanche diode. The floating diffusion region FD may vertically overlap with a portion of the photocharge collection region 130. The floating diffusion region FD may be formed by ion-implanting dopants having the second conductivity type different from the first conductivity type of the semiconductor substrate 100. For example, the floating diffusion region FD may be an n-type dopant region. When the image sensor operates, a pixel signal may be output from the floating diffusion region FD, or a reset voltage may be applied to the floating diffusion region FD.

The charge multiplication region 120a may be provided between the photocharge collection region 130 and the floating diffusion region FD. The charge multiplication region 120a may include dopants having the first conductivity type.

In each of the pixel regions PR, the control transistor may include a vertical gate electrode TG. The control transistor may have a channel in the charge multiplication region 120a adjacent to a side surface of the vertical gate electrode TG. When the image sensor operates, a turn-on voltage or a turn-off voltage may be applied to the vertical gate electrode TG.

The vertical gate electrode TG may be provided in a vertical trench recessed from the first surface 100a of the semiconductor substrate 100. The vertical gate electrode TG may have a structure inserted in the semiconductor substrate

100. The vertical gate electrode TG may isolate and separate the anode region 120b and the floating diffusion region FD from each other. The floating diffusion region FD may be provided inside the vertical gate electrode TG, and the anode region 120b may be provided outside the vertical gate electrode TG. A bottom surface of the vertical gate electrode TG may be located at a lower level than the first surface 100a of the semiconductor substrate 100 and may be adjacent to the photocharge collection region 130.

The vertical gate electrode TG may include a lower portion disposed in the trench formed in the first surface 100a of the semiconductor substrate 100, and an upper portion connected to the lower portion and protruding above the first surface 100a of the semiconductor substrate 100. The vertical gate electrode TG may form a channel in a direction substantially perpendicular to the first surface 100a of the semiconductor substrate 100.

The vertical gate electrode TG may be disposed on the photocharge collection region 130. In addition, the vertical gate electrode TG may overlap with the photocharge collection region 130 when viewed in a plan view.

For example, the vertical gate electrode TG may have a closed curve shape (i.e., a ring shape or a tube shape) when viewed in a plan view. The vertical gate electrode TG may have an opening (i.e., a hollow region) corresponding to an empty space in its central portion. In some embodiments, the vertical gate electrode TG may have a circular, tetragonal or polygonal shape having the opening in its central portion when viewed in a plan view. A diameter R of the vertical gate electrode TG having the ring shape may be substantially equal to or greater than a diameter of the photocharge collection region 130.

The vertical gate electrode TG may isolate and separate the charge multiplication region 120a and the anode region 120b from each other. For example, the charge multiplication region 120a may be provided inside the vertical gate electrode TG, and the anode region 120b may be provided outside the vertical gate electrode TG.

The vertical gate electrode TG may surround the floating diffusion region FD and the charge multiplication region 120a when viewed in a plan view. In this regard, the floating diffusion region FD may be provided in the opening of the vertical gate electrode TG.

A gate insulating layer GIL may be disposed between the vertical gate electrode TG and the semiconductor substrate 100. The gate insulating layer GIL may conformally surround the bottom surface and both side surfaces of the vertical gate electrode TG in the semiconductor substrate 100. For example, the gate insulating layer GIL may be formed of a silicon oxide layer, a silicon oxynitride layer, a high-k dielectric layer having a dielectric constant higher than that of the silicon oxide layer, or any combination thereof.

An interlayer insulating layer 140 may cover the vertical gate electrode TG on the first surface 100a of the semiconductor substrate 100. A first contact plug 141 connected to the floating diffusion region FD, a second contact plug 142, and a third contact plug 143 connected to the vertical gate electrode TG connected to the anode region 120b may be provided in the interlayer insulating layer 140.

Metal lines may be disposed on the interlayer insulating layer 140, and the first to third contact plugs 141, 142, and 143 may be connected to the metal lines.

A surface insulating layer 310 may be provided on the second surface 100b of the semiconductor substrate 100. The surface insulating layer 310 may include a fixed charge layer, an anti-reflection layer, and a planarization layer. The fixed charge layer may prevent charges (i.e., electrons or holes), generated by defects existing at the second surface 100b of the semiconductor substrate 100, from moving into the photoelectric conversion regions 110. For example, the fixed charge layer may include a metal oxide or metal fluoride including at least one of hafnium (Hf), zirconium (Zr), aluminum (Al), tantalum (Ta), titanium (Ti), yttrium (Y), or a lanthanoid (e.g., La). The anti-reflection layer may prevent light incident on the semiconductor substrate 100 from being reflected at the second surface 100b of the semiconductor substrate 100 and may be formed of a material having a refractive index lower than that of the semiconductor substrate 100. For example, the anti-reflection layer may include hafnium oxide ($HfO_2$), aluminum oxide ($Al_2O_3$), titanium oxide ($TiO_2$), and/or strontium titan oxide (STO). The planarization layer may be formed of an insulating material (e.g., silicon oxide ($SiO_2$), silicon nitride (SiN), and/or silicon oxynitride (SiON)), and/or an organic material (e.g., a resin).

Micro lenses 320 may be disposed on the surface insulating layer 310 to correspond to the pixel regions PR, respectively. Each of the micro lenses 320 may have a convex shape and may have a specific radius of curvature. The micro lenses 320 may be formed of a light transmitting resin.

Figure 6:
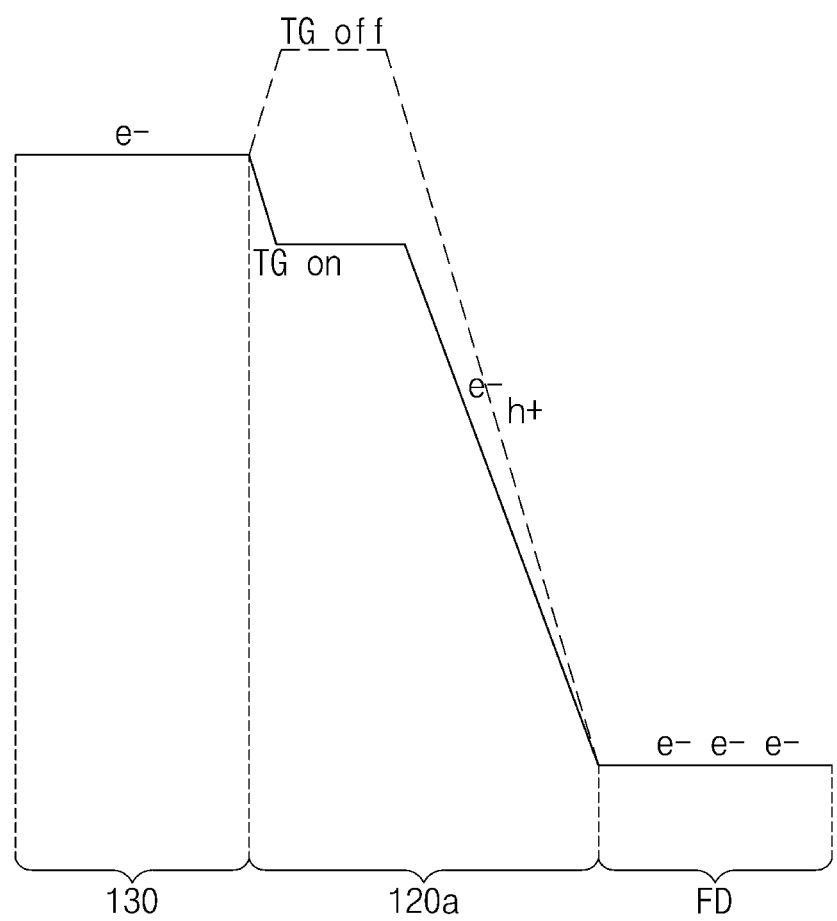
FIG. 6 is a schematic view for explaining an operation of an image sensor according to some embodiments.

FIG. 6 is a schematic view for explaining an operation of an image sensor according to some embodiments.

Referring to FIGS. 5 and 6, in an operation of the image sensor according to embodiments, a high negative voltage (about −6V to about −10V) may be applied to the anode region 120b, and a high positive voltage (about +6V to about +10V) may be applied to the floating diffusion region FD. When a turn-on voltage is applied to the vertical gate electrode TG under these voltage conditions where a reverse voltage is applied between the anode region and the floating diffusion region, a high electric field may be formed in the charge multiplication region 120a. At this time, when a photon is incident on the photoelectric conversion region 110, an electron generated by the incident photon may generate impact ionization (i.e., generation of an electron-hole pair) while passing through the charge multiplication region 120a via the photocharge collection region 130. In this regard, a carrier (an electron or a hole) generated based on incident light and electrons and holes generated by the impact ionization may collide with each other to generate a lot of carriers between the photocharge collection region 130 and the floating diffusion region FD. Thus, a single photon that is incident on the photoelectric conversion region 110 may trigger avalanche breakdown to generate a measurable current pulse. The generated current may be output through the floating diffusion region FD. In addition, a time for which a current instantaneously flows may be detected by a readout circuit so that a distance may be measured with high precision. According to the embodiments, the avalanche phenomenon may occur only for a short time when the turn-on voltage is applied to the vertical gate electrode TG, thereby reducing a dark current.

After the current resulting from the single photon is output, a turn-off voltage may be applied to the vertical gate electrode TG, and a reset voltage (e.g., about 2.8V) may be applied to the floating diffusion region FD to discharge remaining charges. Thus, a dark current may be prevented while the control transistor is turned-off.

Figure 7:
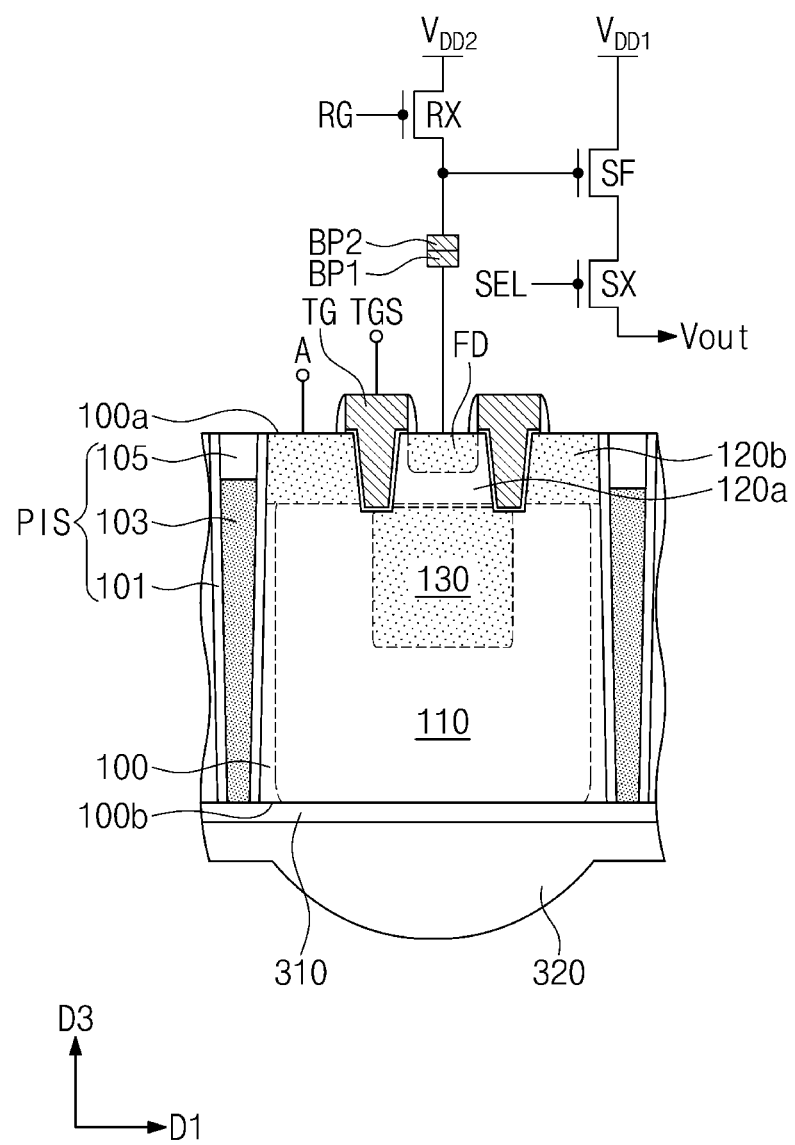
FIG. 7 is a schematic cross-sectional view illustrating an image sensor according to some embodiments.

FIG. 7 is a schematic cross-sectional view illustrating a unit pixel of an image sensor according to some embodiments. For convenience in explanation, components described above will be indicated by the same reference designators, and the descriptions thereto will be omitted or mentioned briefly.

Each of unit pixels may include a readout circuit. Referring to FIG. 7, the readout circuit may include a reset transistor RX, a source follower transistor SF, and a selection transistor SX. In some embodiments, the readout circuit of each of the unit pixels may be provided on a separate semiconductor substrate. In detail, an image sensor may have a structure in which a first chip including the photodetectors (i.e., the avalanche photodiodes) is directly bonded to a second chip including the readout circuits through bonding pads BP1 and BP2.

More particularly, a first bonding pad BP1 may be electrically connected to the floating diffusion region FD, and a drain terminal of the reset transistor RX may be electrically connected to a second bonding pad BP2. The second bonding pad BP2 may be bonded to the first bonding pad BP1. In a case in which the first and second bonding pads BP1 and BP2 are formed of copper (Cu), the bonding method may be a Cu-to-Cu bonding method, and for example, the first and second bonding pads BP1 and BP2 may be formed of aluminum (Al) or tungsten (W).

The reset transistor RX may periodically reset charges accumulated in the floating diffusion region FD in accordance with a reset signal RG applied to a reset gate electrode. The drain terminal of the reset transistor RX may be connected to the floating diffusion region FD, and a source terminal of the reset transistor RX may be connected to a pixel reset voltage $V_{DD2}$. When the reset transistor RX is turned-on, the pixel reset voltage $V_{DD2}$ connected to the source terminal of the reset transistor RX may be transmitted to the floating diffusion region FD. Thus, when the reset transistor RX is turned-on, the charges accumulated in the floating diffusion region FD may be discharged and the floating diffusion region FD may be reset. In some embodiments, the pixel reset voltage $V_{DD2}$ may be a high voltage of about 6V or more, and a pixel power voltage $V_{DD1}$ may be, for example, about 3V.

The source follower transistor SF may be a source follower buffer amplifier which may generate a source-drain current in proportion to the amount of charges accumulated in the floating diffusion region FD and provided to a source follower gate electrode. The source follower transistor SF may amplify a potential change in the floating diffusion region FD and may output the amplified signal to an output line Vout through the selection transistor SX. A source terminal of the source follower transistor SF may be connected to the pixel power voltage $V_{DD1}$, and a drain terminal of the source follower transistor SF may be connected to a source terminal of the selection transistor SX. In some embodiments, the pixel reset voltage $V_{DD2}$ corresponding to the high voltage may be applied to the gate electrode of the source follower transistor SF, and thus the source follower transistor SF may be a high-voltage transistor including a thick gate insulating layer.

A selection signal SEL may select the unit pixels to be read per row. The selection signal SEL may be provided to the selection transistor SX of each of the unit pixels in a row. When the selection transistor SX is turned-on by a selection signal SEL applied to a selection gate electrode, an electrical signal output from the drain terminal of the source follower transistor SF may be output to the output line Vout.

Figure 8A:
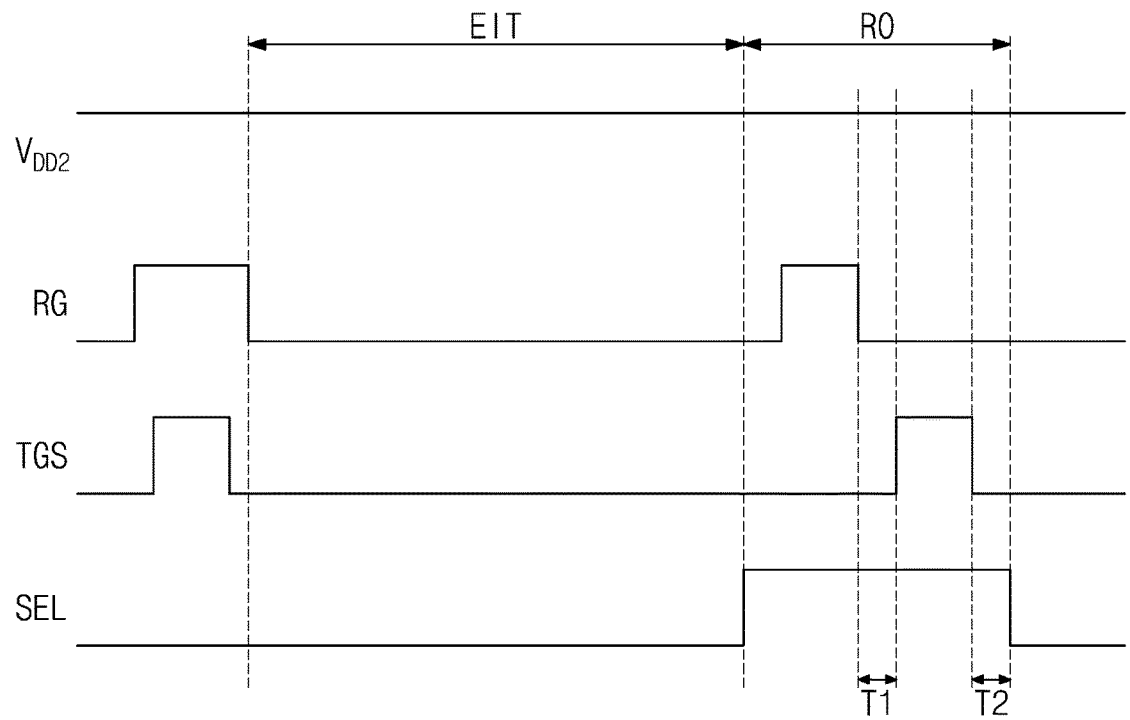
FIGS. 8A and 8B are timing diagrams for explaining an operation of the image sensor of FIG. 7.
Figure 8B:
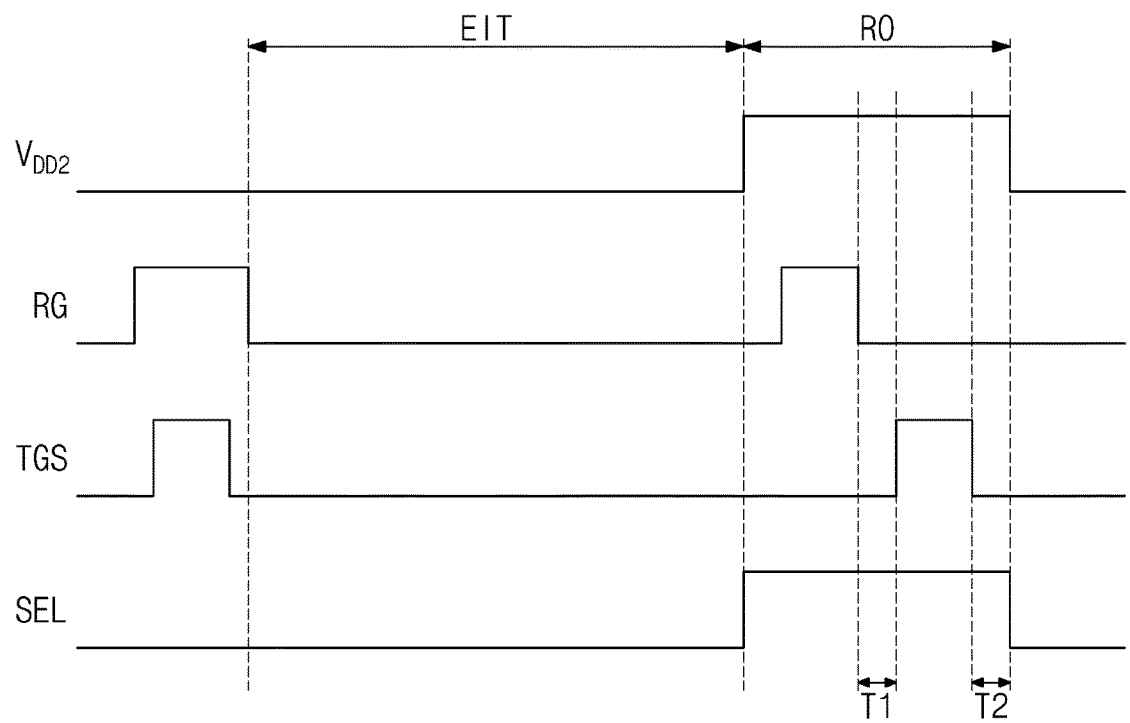

FIGS. 8A and 8B are timing diagrams for explaining an operation of the image sensor of FIG. 7. For convenience in explanation, components described above will be indicated by the same reference designators, and the descriptions thereto will be omitted or mentioned briefly.

Referring to FIG. 8A, an operation of the unit pixels may include a light integration mode (or effective integration time) EIT in which information about an image of an object (or subject) is gathered, and a readout mode RO in which the information about the image of the object is output as an electrical signal.

A high voltage of about 6V may be applied as the pixel reset voltage $V_{DD2}$ during the light integration mode EIT and the readout mode RO. In this regard, the high voltage may be applied to the source terminal of the reset transistor RX during the light integration mode EIT and the readout mode RO. The light integration mode EIT may be performed after resetting the photocharge collection region 130 and the floating diffusion region FD.

The floating diffusion region FD may be reset by applying the turn-on voltage to the gate electrode of the reset transistor RX. The floating diffusion region FD may be reset after photocharges are integrated and before a control signal TGS applied to the vertical gate electrode TG is activated again. In the readout mode RO, a reset potential of the floating diffusion region FD may be detected during a first period T1 immediately after the reset signal RG is inactivated, and thus a floating diffusion reset signal may be output. Thereafter, when the control signal TGS is activated (i.e., the turn-on voltage is applied to the vertical gate electrode TG), the avalanche phenomenon may occur, and a pixel signal may be output during a second period T2 immediately after the control signal TGS is inactivated.

In some embodiments, to induce an avalanche phenomenon, a negative voltage may be applied to the anode region 120b or a high voltage may be applied to the floating diffusion region FD. For example, when a voltage of about –6V or less is applied to the anode region 120b and the control signal TGS is inactivated (i.e., the turn-off voltage is applied to the vertical gate electrode TG), the photocharge collection region 130 may be electrically isolated from the floating diffusion region FD and a potential of the anode region 120b may be transmitted to the photocharge collection region 130, and thus the avalanche phenomenon may not occur. When 0V is applied to the anode region 120b, each of the unit pixels may operate in a non-avalanche mode, functioning as a general photodiode.

For example, even though the high voltage of about 6V or more is applied as the pixel reset voltage $V_{DD2}$, the avalanche phenomenon may not occur in the photocharge collection region 130 when the turn-off voltage is applied to the vertical gate electrode TG. When the same voltage (e.g., about 3V) as the pixel power voltage $V_{DD1}$ is applied as the pixel reset voltage $V_{DD2}$, each of the unit pixels may operate in a non-avalanche mode, functioning as a general photodiode.

According to embodiments, as shown in FIG. 8B, a low voltage of about 3V may be applied as the pixel reset voltage $V_{DD2}$ during the light integration mode EIT, and a high voltage of about 6V may be applied as the pixel reset voltage $V_{DD2}$ during the readout mode RO. Thus, the low voltage may be applied to the source terminal of the reset transistor RX during the light integration mode EIT, and the high voltage may be applied to the source terminal of the reset transistor RX during the readout mode RO. Under these conditions, in the readout mode RO, a reset potential of the floating diffusion region FD may be detected during the first period T1 immediately after the reset signal RX is inactivated, and thus a floating diffusion reset signal may be output. Thereafter, when the control signal TGS is activated (i.e., the turn-on voltage is applied to the vertical gate electrode TG), the avalanche phenomenon may occur, and a pixel signal may be output during the second period T2 immediately after the control signal TGS is inactivated.

Figure 9:
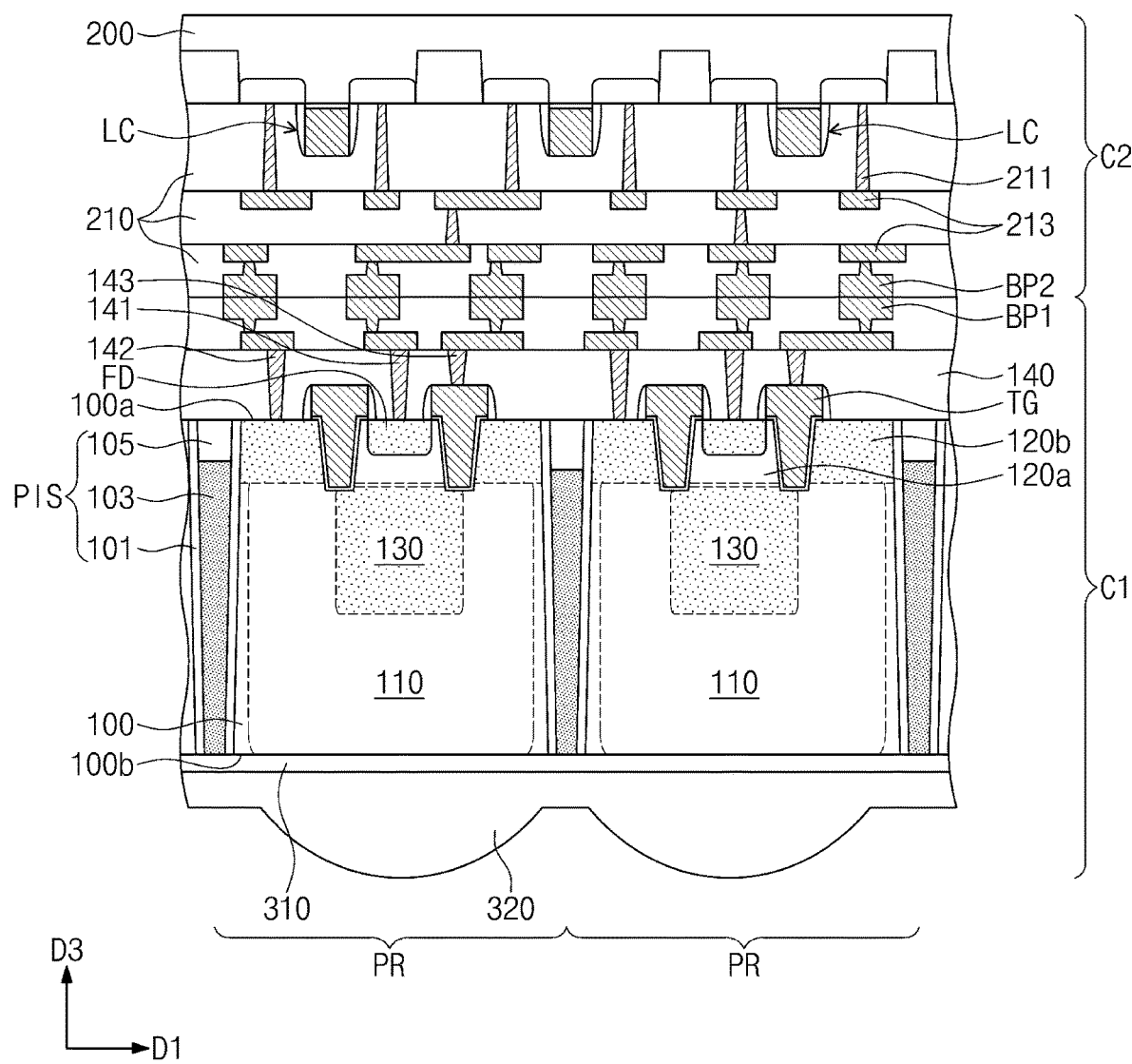
FIG. 9 is a cross-sectional view illustrating an image sensor according to some embodiments.

FIG. 9 is a cross-sectional view illustrating an image sensor according to some embodiments.

Referring to FIG. 9, an image sensor may have a chip-to-chip (C2C) structure. The C2C structure may be manufactured by manufacturing a first chip C1 including photoelectric conversion elements on a first semiconductor substrate (or a first wafer) 100, manufacturing a second chip C2 including readout circuits on a second semiconductor substrate 200 (or a second wafer) different from the first semiconductor substrate 100, and connecting the first chip C1 and the second chip C2 to each other by a bonding method. For example, the bonding method may indicate a method of electrically and physically connecting first bonding pads BP1 formed in an uppermost metal layer of the first chip C1 to second bonding pads BP2 formed in an uppermost metal layer of the second chip C2.

More particularly, the first chip C1 may have the same technical features as the aforementioned image sensors. In this regard, as described above, the first chip C1 may include the photoelectric conversion region 110 having the first or second conductivity type, the photocharge collection region 130 having the second conductivity type, the floating diffusion region FD having the second conductivity type, the charge multiplication region 120a between the photocharge collection region 130 and the floating diffusion region FD, the anode region 120b, and the vertical gate electrode TG in each of the pixel regions PR. In addition, the first chip C1 of the image sensor may include the first bonding pads BP1 provided in its uppermost metal layer. The first bonding pads BP1 may have a surface coplanar with a surface of an uppermost first insulating layer 140 of the first chip C1. The first bonding pads BP1 may be electrically connected to the vertical gate electrode TG, the floating diffusion region FD, and the anode region 120b through interconnection lines and contact plugs.

The second chip C2 may include the second semiconductor substrate 200, readout circuits LC, contact plugs 211 connected to the readout circuits LC, interconnection lines 213, and second insulating layers 210. In addition, the second chip C2 may include the second bonding pads BP2 provided in an uppermost metal layer of the readout circuits. For example, the first and second bonding pads BP1 and BP2 may include at least one of tungsten (W), aluminum (Al), copper (Cu), tungsten nitride (WN), tantalum nitride (TaN), or titanium nitride (TiN).

The second bonding pads BP2 may be electrically connected directly to the first bonding pads BP1 by a hybrid bonding method. The hybrid bonding may indicate that two components including the same kind of a material are fused together at their interface. For example, in a case in which the first and second bonding pads BP1 and BP2 are formed of copper (Cu), the first and second bonding pads BP1 and BP2 may be physically and electrically connected to each other by a copper (Cu)-copper (Cu) bonding method. In addition, the surface of the uppermost first insulating layer 140 of the first chip C1 may be bonded to a surface of an uppermost second insulating layer 210 of the second chip C2 by a dielectric material-dielectric material bonding method.

Figure 10:
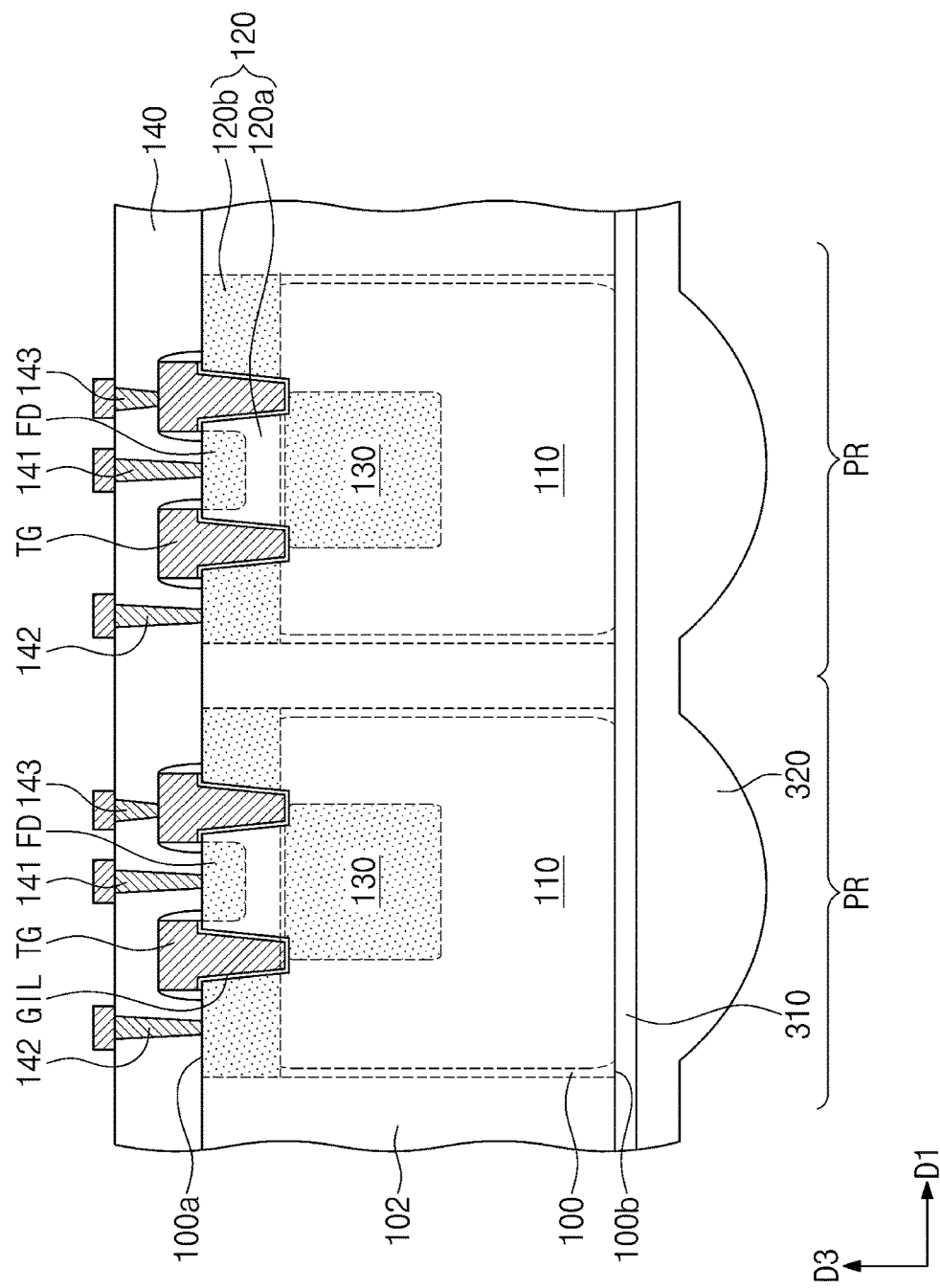
FIGS. 10, 11 and 12 are cross-sectional views illustrating image sensors according to some embodiments.
Figure 11:
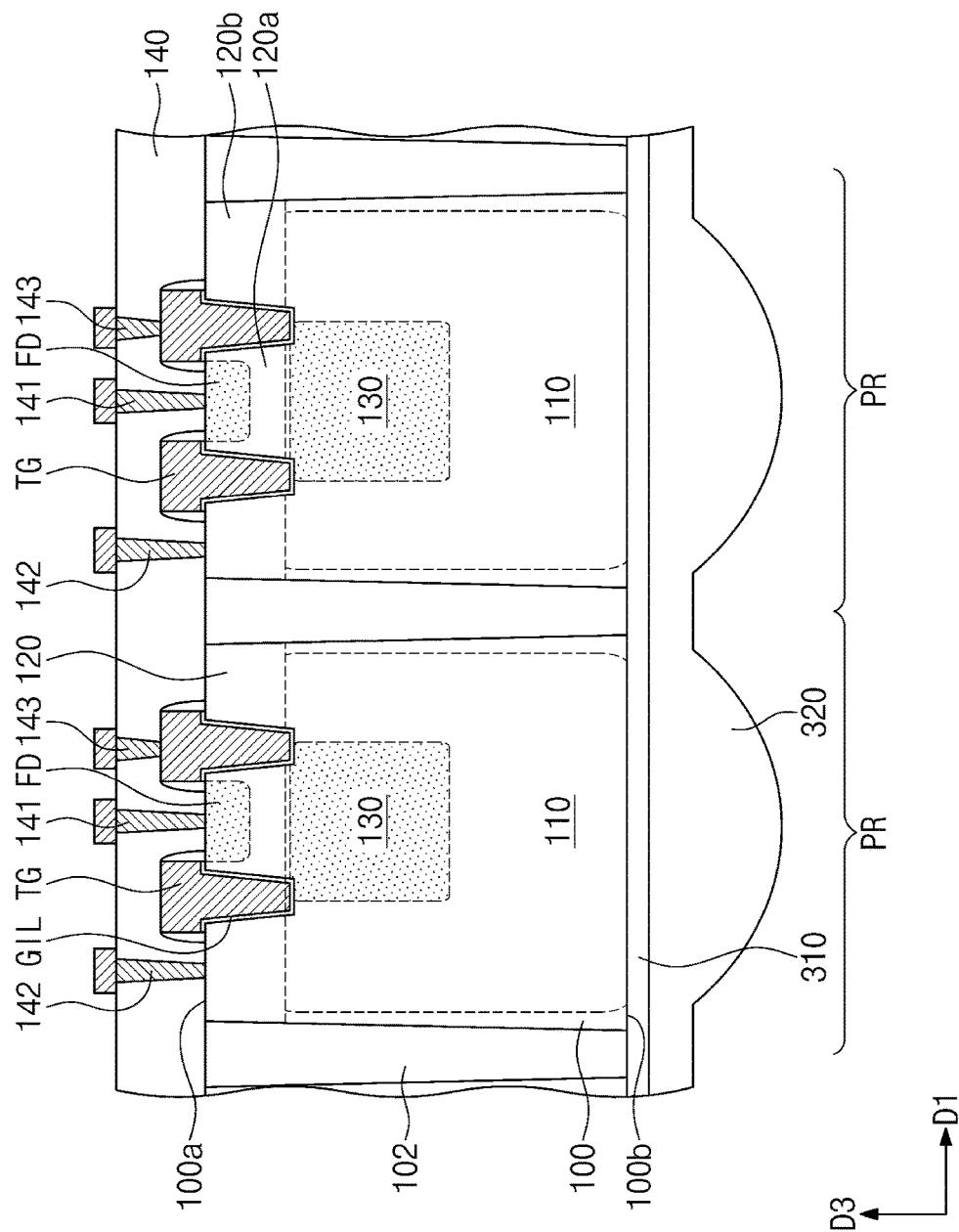
Figure 12:
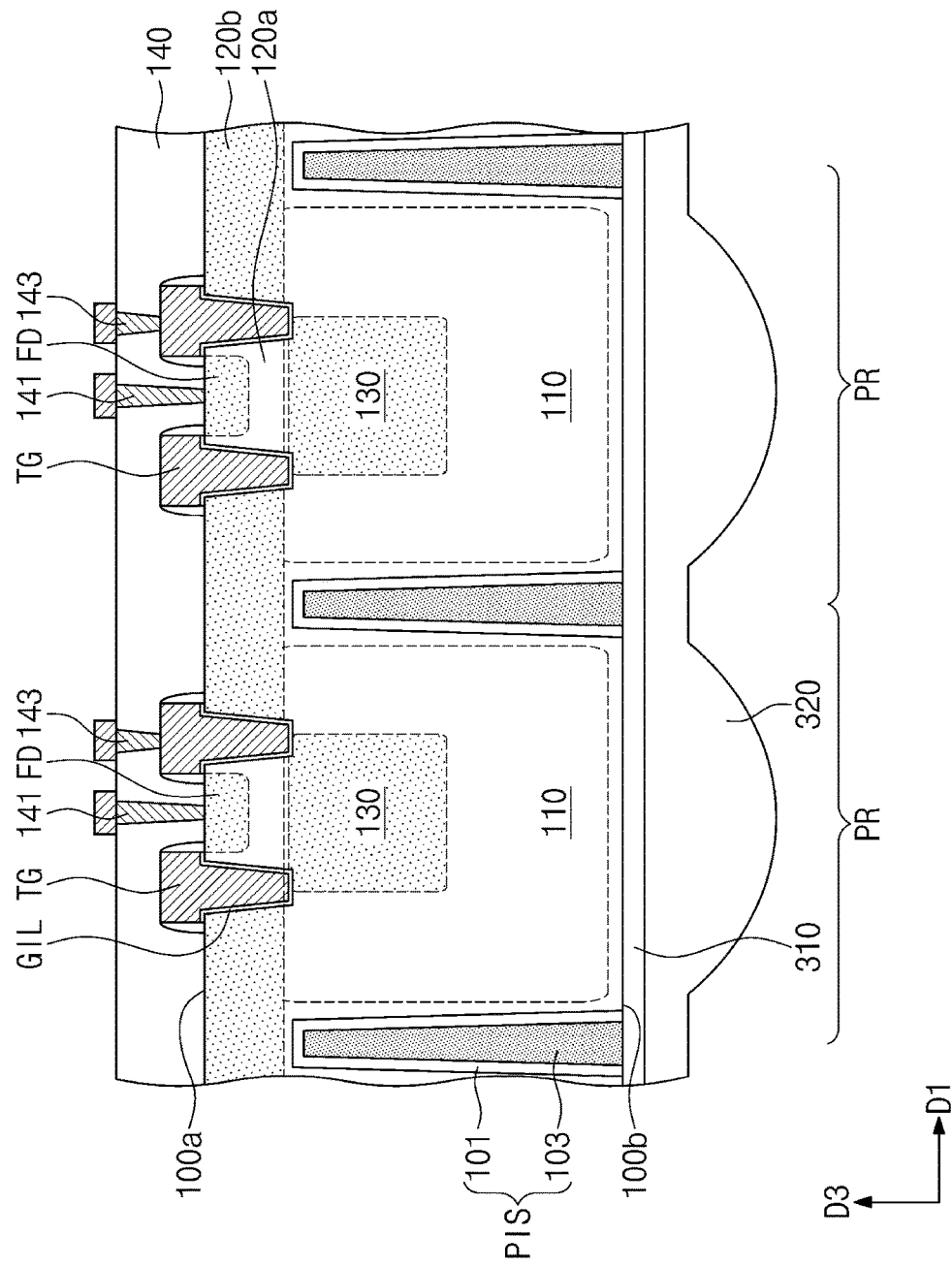

FIGS. 10, 11 and 12 are cross-sectional views illustrating image sensors according to some embodiments. Hereinafter, descriptions corresponding to those provided above will be omitted or mentioned briefly.

Referring to FIGS. 10, 11 and 12, as described above, an image sensor may include the pixel regions PR defined by the pixel isolation structure PIS provided in the semiconductor substrate 100.

As shown in FIG. 10, a pixel isolation structure may be a dopant region 102 which has the first conductivity type and is formed in the semiconductor substrate 100 and may be formed by ion-implanting dopants having the first conductivity type into the semiconductor substrate 100. For example, the pixel isolation structure may be formed by ion-implanting the dopants having the first conductivity type into the first surface 100a or the second surface 100b of the semiconductor substrate 100.

The pixel isolation structure may be the dopant region 102 having the first conductivity type and a high concentration, and thus a high potential barrier may be formed between the pixel regions PR.

As shown in FIG. 11, a pixel isolation structure may be formed of an insulating material 102 having a refractive index lower than that of the semiconductor substrate (e.g., silicon) 100 and may include one or more insulating layers. For example, the pixel isolation structure may include a silicon oxide layer and/or a silicon nitride layer. The first surface 100a and/or the second surface 100b of the semiconductor substrate 100 may be patterned to form a deep trench, and then, the deep trench may be filled with the insulating material to form the pixel isolation structure.

As shown in FIG. 11, the pixel isolation structure may vertically extend completely through the semiconductor substrate 100. However, embodiments are not limited thereto and the pixel isolation structure may penetrate a portion of the semiconductor substrate 100. For example, a vertical thickness of the pixel isolation structure may be substantially equal to a vertical thickness of the semiconductor substrate 100.

The pixel isolation structure may have a first width adjacent to the first surface 100a of the semiconductor substrate 100 and a second width adjacent to the second surface 100b of the semiconductor substrate 100, and the first width may be greater than the second width or vice versa. A width of the pixel isolation structure may become progressively less from the first surface 100a toward the second surface 100b of the semiconductor substrate 100.

As shown in FIG. 12, a pixel isolation structure PIS may extend from the second surface 100b toward the first surface 100a of the semiconductor substrate 100. A width of the pixel isolation structure PIS may progressively decrease from the second surface 100b toward the first surface 100a of the semiconductor substrate 100. The pixel isolation structure PIS may vertically penetrate a portion of the semiconductor substrate 100 and may be vertically spaced apart from the first surface 100a of the semiconductor substrate 100.

The pixel isolation structure PIS may include a liner insulating pattern 101 and a conductive pattern 103. Here, the conductive pattern 103 may have a surface coplanar with the second surface 100b of the semiconductor substrate 100.

FIGS. 13, 14, 15 and 16 are cross-sectional views illustrating image sensors according to some embodiments. Hereinafter, descriptions corresponding to those provided above will be omitted or mentioned briefly.

Figure 13:
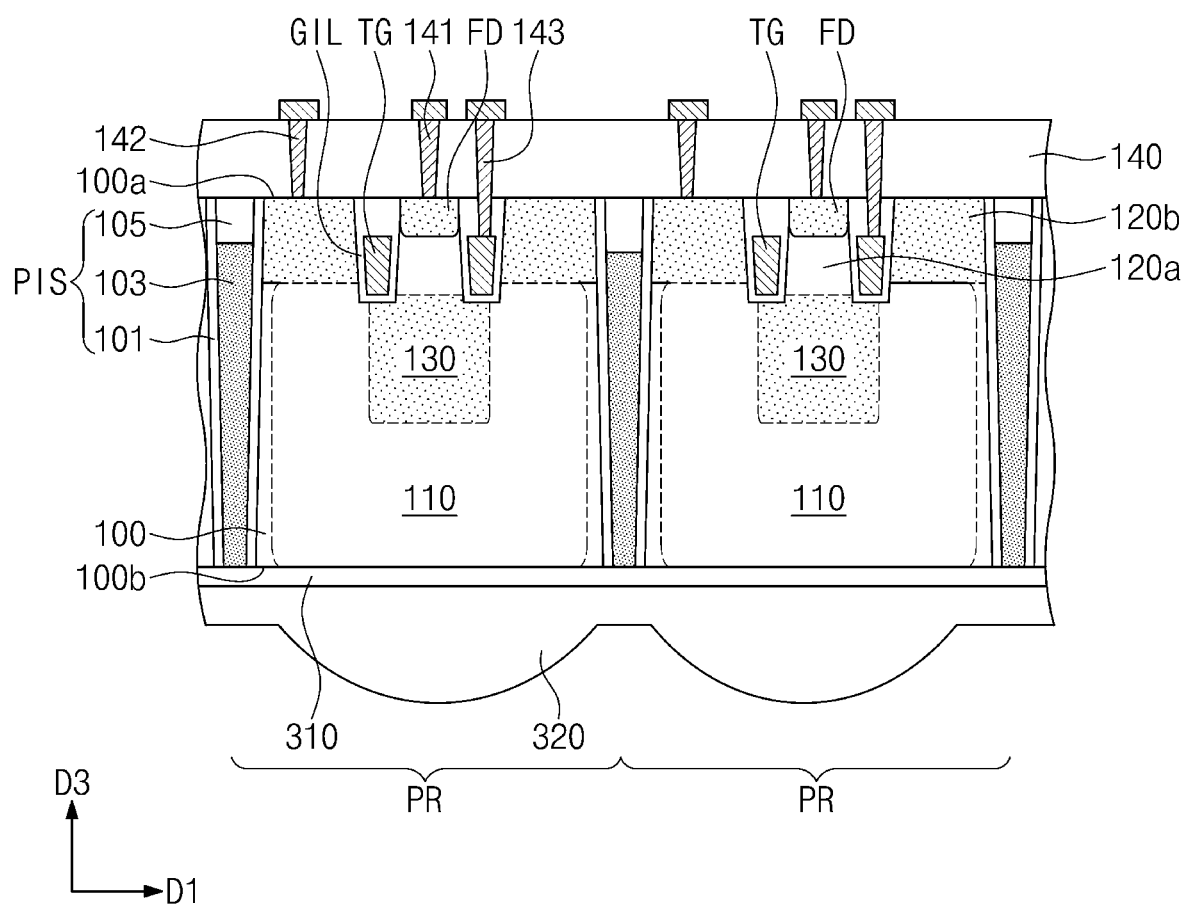
FIGS. 13, 14, 15 and 16 are cross-sectional views illustrating image sensors according to some embodiments.
Figure 14:
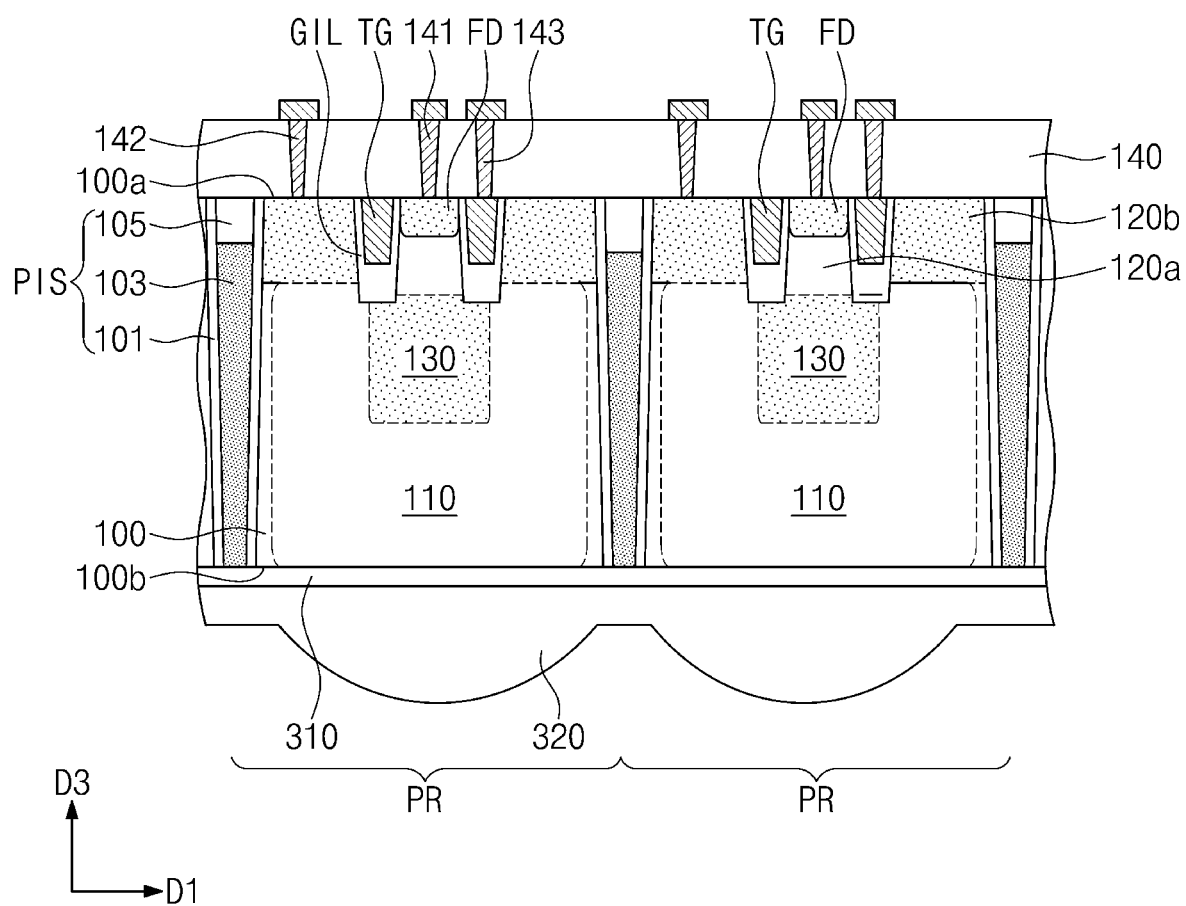

According to embodiments, as shown in FIGS. 13 and 14, a vertical gate electrode TG may be completely buried in the semiconductor substrate 100 to control a position in which the avalanche phenomenon occurs. In this regard, the vertical gate electrode TG may have a ring shape in a plan view as described above and may be completely surrounded by a gate insulating layer GIL. Referring to FIG. 13, a thickness of the gate insulating layer GIL in the third direction D3 may be greater on a top surface of the vertical gate electrode TG than on a bottom surface of the vertical gate electrode TG. In addition, the floating diffusion region FD may be surrounded by the gate insulating layer GIL. Alternatively, as shown in FIG. 14, a thickness of the gate insulating layer GIL in the third direction D3 may be greater on the bottom surface of the vertical gate electrode TG than on a side surface of the vertical gate electrode TG. In this case, a portion of the side surface of the vertical gate electrode TG may be adjacent to the charge multiplication region 120a.

Figure 15:
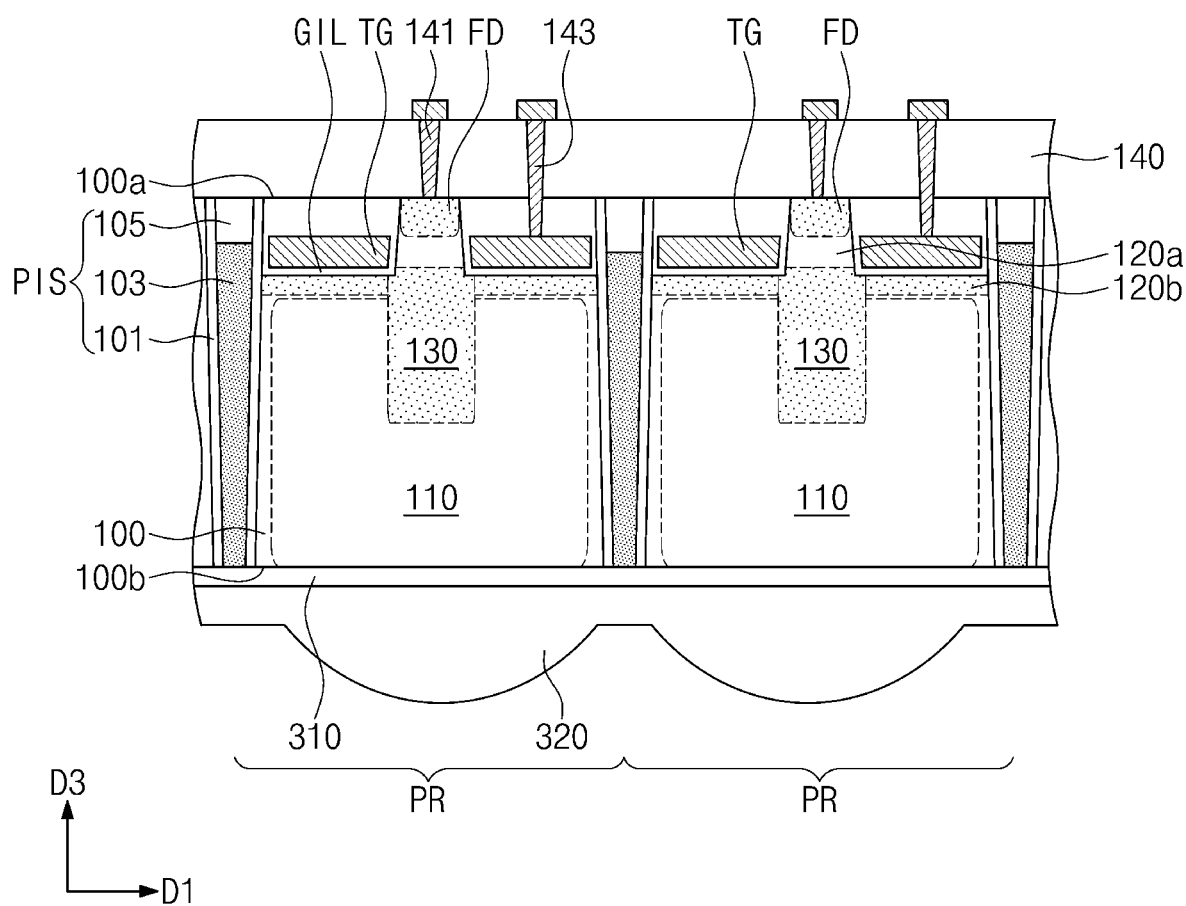

According to embodiments, as shown in FIG. 15, a vertical gate electrode TG may overlap, along the third direction D3, with the whole of the photoelectric conversion region 110 except the photocharge collection region 130. A thick gate insulating layer GIL may be provided on a top surface of the vertical gate electrode TG, and the floating diffusion region FD may be surrounded by the gate insulating layer GIL. A portion of the gate insulating layer GIL may be disposed between a side surface of the vertical gate electrode TG and the pixel isolation structure PIS. In addition, an anode region 120b may be provided between the vertical gate electrode TG and the photoelectric conversion region 110.

Figure 16:
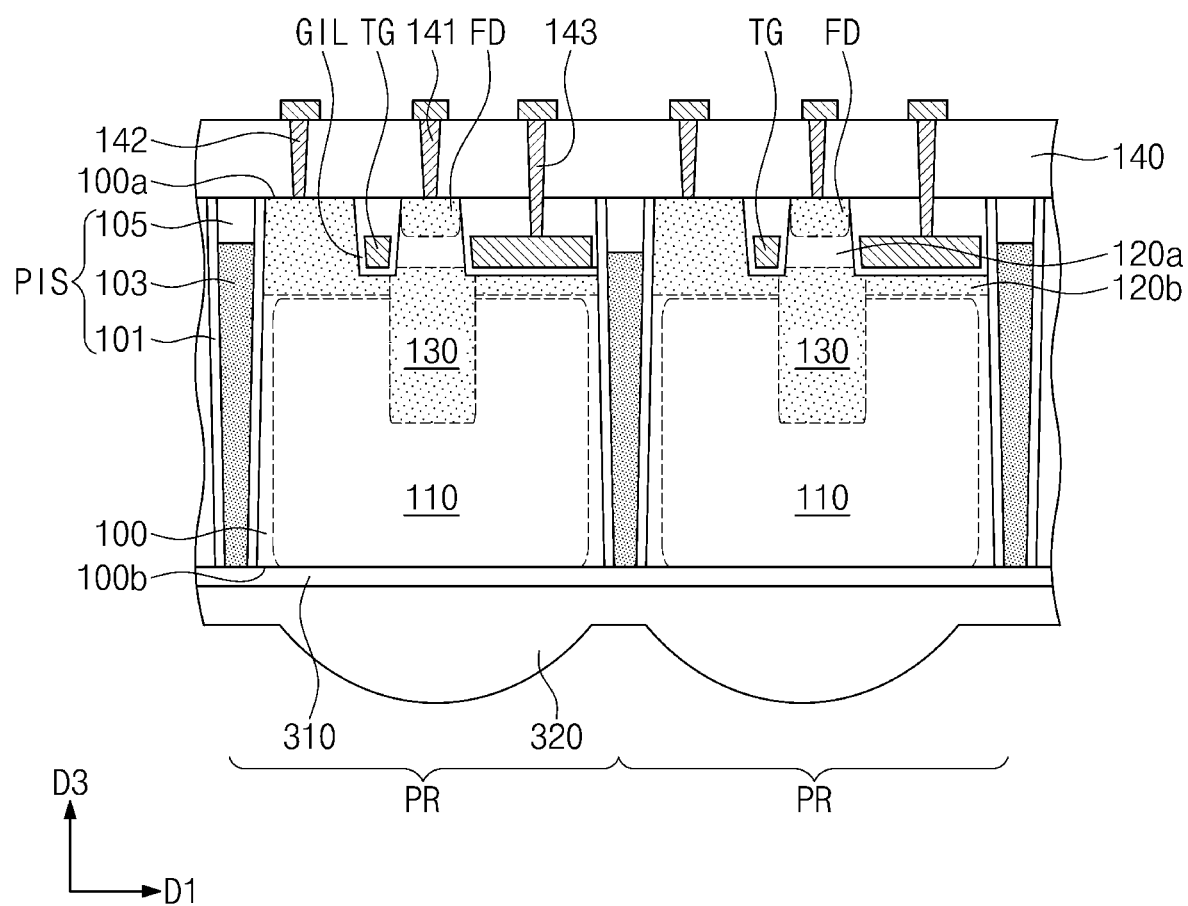

According to embodiments, as shown in FIG. 16, a side surface of a vertical gate electrode TG may be adjacent to the pixel isolation structure PIS, and another side surface of the vertical gate electrode TG may be spaced apart from the pixel isolation structure PIS. A thick gate insulating layer GIL may be provided on a top surface of the vertical gate electrode TG, and the floating diffusion region FD may be surrounded by the gate insulating layer GIL.

Figure 17:
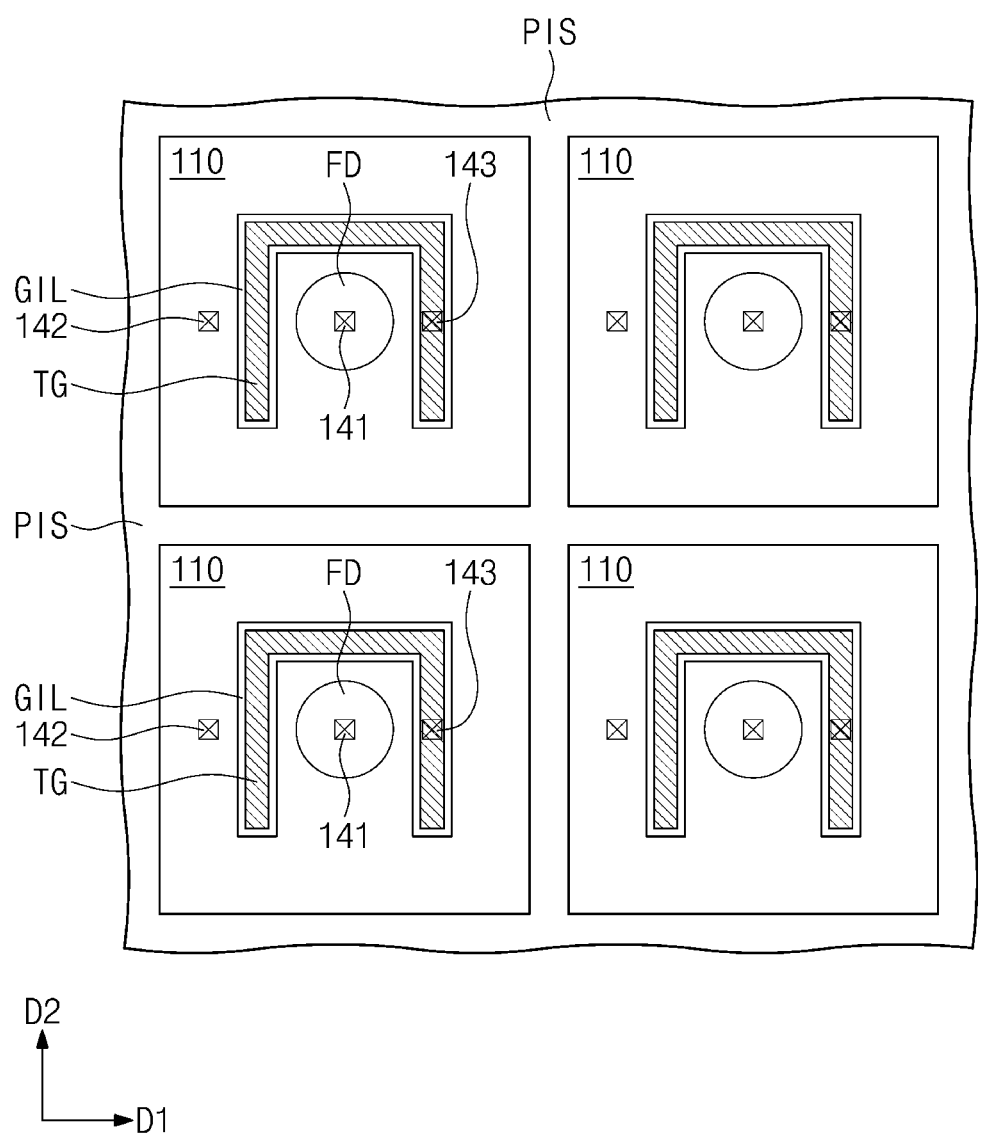
FIGS. 17 and 18 are plan views illustrating image sensors according to some embodiments.
Figure 18:
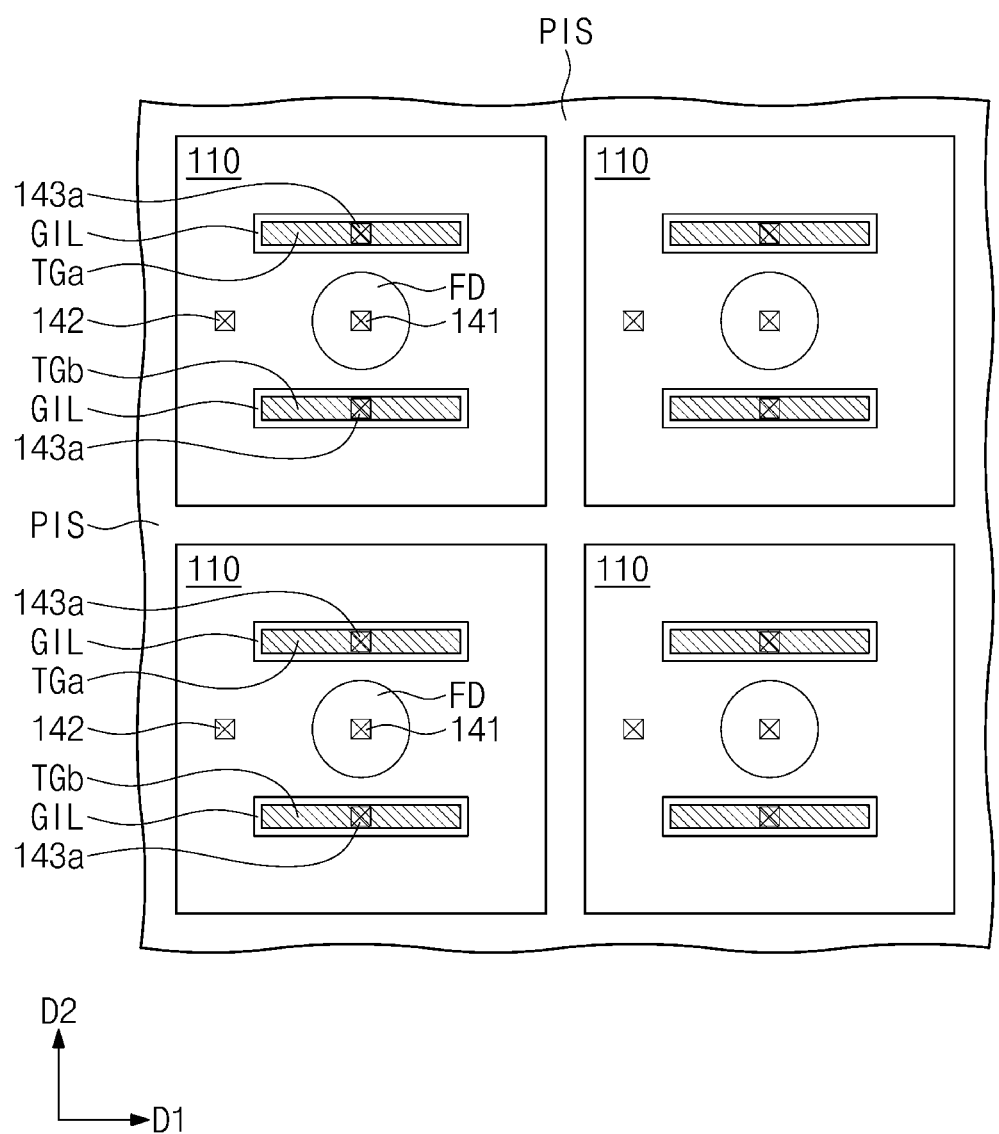

FIGS. 17 and 18 are plan views illustrating image sensors according to some embodiments. Hereinafter, descriptions corresponding to those provided above will be omitted or mentioned briefly.

Referring to FIG. 17, as described above, a single photodetector and a vertical gate electrode TG may be provided in each of the pixel regions PR.

The vertical gate electrode TG may be disposed around the floating diffusion region FD in a plan view and may have a shape of which a portion is opened. In this regard, the vertical gate electrode TG may partially surround the floating diffusion region FD when viewed in a plan view.

The vertical gate electrode TG may have a ⊏-shape, a reverse L-shape, or a L-shape when viewed in a plan view. More particularly, the vertical gate electrode TG may include at least one first portion parallel to the first direction D1 and at least one second portion parallel to the second direction D2. For example, the vertical gate electrode TG may include the first portions opposite to each other and the second portion connecting the first portions.

Referring to FIG. 18, a vertical gate electrode TG may have a pair of sub-gate electrodes TGa and TGb spaced apart from each other with the floating diffusion region FD interposed therebetween. The pair of sub-gate electrodes TGa and TGb may be connected in common to a single metal line and thus may be controlled at the same time.

While the control transistor is turned-on, the avalanche phenomenon may be induced in the charge multiplication region between the photoelectric conversion region and the floating diffusion region. Thus, a dark current may be inhibited while the control transistor is turned-off. As a result, a loss of photocharges may be minimized when the image sensor operates, and thus reliability of the image sensor may be improved.

In addition, according to embodiments, the avalanche phenomenon may be induced inside the vertical gate electrode having the ring shape, and thus a size of the image sensor may be reduced.

In some embodiments, each of the components represented by a block as illustrated in FIG. 2 may be implemented as various numbers of hardware, software and/or firmware structures that execute respective functions described above, according to embodiments. For example, at least one of these components may include various hardware components including a digital circuit, a programmable or non-programmable logic device or array, an application specific integrated circuit (ASIC), transistors, capacitors, logic gates, or other circuitry using use a direct circuit structure, such as a memory, a processor, a logic circuit, a look-up table, etc., that may execute the respective functions through controls of one or more microprocessors or other control apparatuses. Also, at least one of these components may include a module, a program, or a part of code, which contains one or more executable instructions for performing specified logic functions, and executed by one or more microprocessors or other control apparatuses. Also, at least one of these components may further include or may be implemented by a processor such as a central processing unit (CPU) that performs the respective functions, a microprocessor, or the like. Functional aspects of embodiments may be implemented in algorithms that execute on one or more processors. Furthermore, the components, elements, modules or units represented by a block or processing steps may employ any number of related art techniques for electronics configuration, signal processing and/or control, data processing and the like.

While aspects of example embodiments have been particularly shown and described, it will be understood by one of ordinary skill in the art that variations in form and detail may be made therein without departing from the spirit and scope of the attached claims.

What is claimed is:

1. An image sensor comprising:
    a photoelectric conversion region in a semiconductor substrate;
    a photocharge collection region provided in the photoelectric conversion region;
    a floating diffusion region in the semiconductor substrate that is spaced apart from the photocharge collection region along a vertical direction;
    a charge multiplication region between the photocharge collection region and the floating diffusion region, wherein the charge multiplication region comprises dopants having a first conductivity type; and
    a vertical gate electrode which extends into the semiconductor substrate and overlaps the photocharge collection region along the vertical direction,
    wherein a side surface of the vertical gate electrode is adjacent to the floating diffusion region and the charge multiplication region.

2. The image sensor of claim 1, wherein the first conductivity type is different from a conductivity type of the photocharge collection region and a conductivity type the floating diffusion region.

3. The image sensor of claim 1, wherein a dopant concentration of the photocharge collection region is greater than a dopant concentration of the photoelectric conversion region.

4. The image sensor of claim 1, further comprising an anode region provided on the photoelectric conversion region and spaced apart from the floating diffusion region along a horizontal direction with the vertical gate electrode interposed therebetween,
wherein the anode region has a conductivity type different from that of the floating diffusion region.

5. The image sensor of claim 1, wherein the vertical gate electrode has a ring shape and surrounds the floating diffusion region when viewed in a plan view.

6. The image sensor of claim 1, wherein the vertical gate electrode partially surrounds the floating diffusion region when viewed in a plan view.

7. The image sensor of claim 1, wherein the vertical gate electrode comprises a pair of sub-gate electrodes that extend in parallel to each other along a horizontal direction with the floating diffusion region interposed therebetween.

8. The image sensor of claim 1, further comprising a pixel isolation structure provided in the semiconductor substrate that defines a pixel region,
wherein the pixel isolation structure surrounds the photoelectric conversion region when viewed in a plan view, and
wherein the floating diffusion region is located in a central portion of the pixel region.

9. The image sensor of claim 8, wherein the pixel isolation structure comprises:
a conductive pattern that extends into the semiconductor substrate along the vertical direction; and
a liner insulating pattern between the conductive pattern and the semiconductor substrate.

10. The image sensor of claim 8, wherein the pixel isolation structure comprises a dopant region doped with dopants that have the first conductivity type, and
wherein the semiconductor substrate has the first conductivity type.

11. An image sensor comprising:
a semiconductor substrate that has a first conductivity type;
a photoelectric conversion region that has a second conductivity type and is provided in the semiconductor substrate;
a photocharge collection region that has the second conductivity type and is provided in the photoelectric conversion region;
a floating diffusion region that has the second conductivity type and is spaced apart from the photocharge collection region along a vertical direction;
a charge multiplication region that has the first conductivity type and is provided between the photocharge collection region and the floating diffusion region;
a vertical gate electrode which extends into the semiconductor substrate, overlaps the photocharge collection region along the vertical direction, and surrounds the floating diffusion region and the charge multiplication region; and
an anode region that has the first conductivity type and is provided in the semiconductor substrate outside the vertical gate electrode.

12. The image sensor of claim 11, further comprising a pixel isolation structure that defines define a pixel region in the semiconductor substrate and surrounds the photoelectric conversion region when viewed in a plan view.

13. The image sensor of claim 12, wherein the pixel isolation structure comprises:
a conductive pattern that extends into the semiconductor substrate along the vertical direction; and
a liner insulating pattern between the conductive pattern and the semiconductor substrate.

14. The image sensor of claim 11, wherein a dopant concentration in the photocharge collection region is greater than a dopant concentration in the photoelectric conversion region.

15. The image sensor of claim 11, wherein a width of the photocharge collection region is substantially equal to a diameter of the vertical gate electrode.

16. The image sensor of claim 11, wherein the floating diffusion region is self-aligned with an inner side surface of the vertical gate electrode.

17. An image sensor comprising:
a semiconductor substrate that has a first conductivity type;
a pixel isolation structure in the semiconductor substrate that defines a plurality of pixel regions;
a photoelectric conversion region provided in the semiconductor substrate in each of the plurality of pixel regions and comprising dopants having a second conductivity type;
a photocharge collection region that has the second conductivity type and is provided in the photoelectric conversion region;
a floating diffusion region that has the second conductivity type, is adjacent to a first surface of the semiconductor substrate in each of the plurality of pixel regions and is spaced apart from the photocharge collection region along a vertical direction;
a charge multiplication region that has the first conductivity type and is provided between the photocharge collection region and the floating diffusion region;
a vertical gate electrode that extends into the semiconductor substrate and surrounds the floating diffusion region and the charge multiplication region;
an anode region that has the first conductivity type and is provided in the semiconductor substrate outside the vertical gate electrode; and
a plurality of micro lenses disposed on a second surface of the semiconductor substrate and provided on the plurality of pixel regions, respectively.

18. The image sensor of claim 17, wherein the vertical gate electrode overlaps with the photocharge collection region along the vertical direction.

19. The image sensor of claim 17, wherein the pixel isolation structure extends from the first surface of the semiconductor substrate to the second surface of the semiconductor substrate.

20. The image sensor of claim 17, wherein the charge multiplication region is configured to induce an avalanche phenomenon based on a reverse bias being applied between the semiconductor substrate and the photoelectric conversion region, and a turn-on voltage being applied to the vertical gate electrode.

* * * * *